(12) United States Patent
Keller

(10) Patent No.: US 8,919,077 B2
(45) Date of Patent: Dec. 30, 2014

(54) SOLAR POWER UNIT AND SYSTEM

(71) Applicant: Alexander Freimark Keller, Bryn Mawr, PA (US)

(72) Inventor: Alexander Freimark Keller, Bryn Mawr, PA (US)

( * ) Notice: Subject to any disclaimer, the term of this patent is extended or adjusted under 35 U.S.C. 154(b) by 0 days.

(21) Appl. No.: 13/928,056

(22) Filed: Jun. 26, 2013

(65) Prior Publication Data

US 2014/0096474 A1    Apr. 10, 2014

Related U.S. Application Data

(63) Continuation of application No. 13/802,469, filed on Mar. 13, 2013.

(60) Provisional application No. 61/710,709, filed on Oct. 6, 2012, provisional application No. 61/734,967, filed on Dec. 8, 2012.

(51) Int. Cl.
| | |
|---|---|
| *E04D 13/18* | (2014.01) |
| *F24J 2/52* | (2006.01) |
| *H02J 7/35* | (2006.01) |
| *H01L 31/042* | (2014.01) |
| *H01L 31/05* | (2014.01) |
| *H01L 31/052* | (2014.01) |

(52) U.S. Cl.
CPC .............. *F24J 2/5252* (2013.01); *H02J 7/355* (2013.01); *H01L 31/0422* (2013.01); *F24J 2/5245* (2013.01); *H01L 31/05* (2013.01); *H01L 31/0521* (2013.01); *Y02B 10/14* (2013.01); *Y02B 10/20* (2013.01); *Y02E 10/47* (2013.01); *Y02E 10/566* (2013.01)
USPC ..................... 52/747.12; 52/173.3; 136/259

(58) Field of Classification Search
USPC ........................ 52/173.3, 604, 747.1, 747.12; 136/243–251, 259; 320/101; 126/621, 126/622
See application file for complete search history.

(56) References Cited

U.S. PATENT DOCUMENTS

| | | | | | |
|---|---|---|---|---|---|
| 1,803,141 | A | * | 4/1931 | Paulissen | .......................... 52/714 |
| 1,963,153 | A | * | 6/1934 | Schmieder | .......................... 52/373 |
| 2,903,879 | A | * | 9/1959 | Williams | .......................... 52/294 |
| 4,069,809 | A | * | 1/1978 | Strand | ............................ 126/630 |
| 4,480,633 | A | | 11/1984 | Farrell | |
| 5,299,403 | A | * | 4/1994 | Fentz | ........................... 52/404.2 |
| 6,148,570 | A | * | 11/2000 | Dinwoodie et al. | .......... 52/173.3 |
| 6,498,289 | B1 | | 12/2002 | Mori et al. | |

(Continued)

FOREIGN PATENT DOCUMENTS

| | | |
|---|---|---|
| CN | 102061784 A | 5/2011 |
| WO | 2011/016777 A1 | 2/2011 |

OTHER PUBLICATIONS

Office Action—Restriction—mailed Oct. 28, 2013 in corresponding U.S. Appl. No. 13/802,469.

(Continued)

*Primary Examiner* — Robert Canfield
*Assistant Examiner* — Babajide Demuren
(74) *Attorney, Agent, or Firm* — Nields, Lemack & Frame, LLC

(57) ABSTRACT

One aspect of the present invention relates to a method for integrating a solar power unit that generates a power signal, into a building structure. The method comprises the steps of attaching a frame of the solar power unit to the building block, installing the solar panel on the attached frame, and securing the solar panel to the attached frame with the front cover.

20 Claims, 31 Drawing Sheets

(56) References Cited

U.S. PATENT DOCUMENTS

| | | |
|---|---|---|
| 7,793,467 B1 | 9/2010 | Melton et al. |
| 7,845,127 B2 | 12/2010 | Brescia |
| 2004/0000334 A1 | 1/2004 | Ressler |
| 2006/0216109 A1* | 9/2006 | Sharkozy .................. 403/387 |
| 2007/0079861 A1 | 4/2007 | Morali |
| 2008/0155908 A1 | 7/2008 | Nomura et al. |
| 2008/0236654 A1 | 10/2008 | Pietrangelo et al. |
| 2009/0230783 A1 | 9/2009 | Weed et al. |
| 2009/0242014 A1 | 10/2009 | Leary |
| 2010/0154327 A1 | 6/2010 | Reyal et al. |
| 2011/0162300 A1 | 7/2011 | Johnson |
| 2011/0225904 A1 | 9/2011 | Railkar et al. |
| 2011/0265401 A1 | 11/2011 | Ritzler et al. |
| 2011/0283635 A1 | 11/2011 | Sato et al. |
| 2012/0047817 A1 | 3/2012 | Prentice |
| 2012/0047826 A1 | 3/2012 | Chang et al. |
| 2012/0085042 A1 | 4/2012 | Macdonald et al. |
| 2012/0233939 A1 | 9/2012 | Prentice |
| 2012/0247721 A1 | 10/2012 | Naneff et al. |
| 2014/0007528 A1 | 1/2014 | Keller |

OTHER PUBLICATIONS

Office Action mailed Feb. 20, 2014 in corresponding U.S. Appl. No. 13/802,469.

Notice of Allowance mailed Sep. 30, 2014 in corresponding U.S. Appl. No. 13/802,469.

* cited by examiner

SOLAR POWER UNIT AND SYSTEM

CROSS-REFERENCE TO RELATED APPLICATION

The present application is a U.S. continuation patent application of, and claims priority under 35 U.S.C. §120 to, U.S. patent application Ser. No. 13/802,469, filed Mar. 13, 2013, a U.S. continuation-in-part patent application of, and claims priority under 35 U.S.C. §120 to, U.S. design patent application Ser. No. 29/426,688, filed Jul. 9, 2012, a U.S. nonprovisional patent application of, and claims priority under 35 U.S.C. §119(e) to, U.S. provisional patent application Ser. No. 61/710,709, filed Oct. 6, 2012, and U.S. provisional patent application Ser. No. 61/734,967, filed Dec. 8, 2012, which design and provisional patent applications are incorporated by reference herein.

FIELD OF INVENTION

The present invention relates generally to solar power. More specifically, the present invention relates to an integrated solar power unit and system.

BACKGROUND

With massive energy demands on our cities, existing surfaces of our built environment fail to harvest and utilize potential solar energy. Existing solar arrays on rooftops are far removed from the architecture of our daily lives and require clumsy equipment that is neither integrated nor aesthetically considered. Also, existing products, for example, solar roofing tile, translucent photovoltaic window modules, and façade panels, do not have the components (e.g., battery, inverter, and other electronics) integrated with the product.

Other existing products have the same issues that typical roof-mounted systems have, complicated wiring configurations that connect to electrical equipment located inside the building. These products are also not structural. Typical solar panels that are applied to the façade or roof of the building are mounted on top of structural building materials.

Therefore, there exists a need for an architecturally integrated technology system that collects, stores, and transforms solar energy into usable electricity. The system may also serve as the structural, exterior finish material of the building, and protect the building from environmental forces (rain, wind, UV degradation, etc.).

SUMMARY

The present invention includes many aspects and features. One aspect of the present invention relates to a method for integrating a solar power unit, for generating a power signal, into a building structure. The building structure includes a plurality of building blocks and the solar power unit comprises a frame and a front cover. The method comprises the steps of attaching the frame of the solar power unit to the building block, installing the solar panel on the attached frame, and securing the solar panel to the attached frame with the front cover.

In a feature of this aspect, the solar power unit further comprises a power outlet for providing the generated power signal to an electronic device coupled to the power outlet.

In a feature of this aspect, the building block is a cinder block.

In a feature of this aspect, the building structure is an exterior cinderblock wall.

Another aspect of the present invention relates to a method for integrating a solar power system that provides a power signal into a building structure. The building structure includes a plurality of building blocks and the solar power system includes a plurality of solar power units. Each of the solar power units comprises a frame and a front cover. The method comprises the steps of attaching the frames of each of the solar power units to a corresponding one of the plurality of building blocks, installing the solar panel on each of the attached frames, and securing the solar panel to each of the attached frames with the corresponding front cover.

In a feature of this aspect, the solar power unit further comprises a power outlet for providing the generated power signal to a device coupled to the power outlet.

In addition to the aforementioned aspects and features of the present invention, it should be noted that the present invention further encompasses the various possible combinations and subcombinations of such aspects and features. Thus, for example, any aspect may be combined with an aforementioned feature in accordance with the present invention without requiring any other aspect or feature.

BRIEF DESCRIPTION OF THE DRAWING(S)

A more detailed understanding of the disclosed system and method may be had from the following description, given by way of example and to be understood in conjunction with the accompanying drawing.

DETAILED DESCRIPTION

As a preliminary matter, it will readily be understood by one having ordinary skill in the relevant art ("Ordinary Artisan") that the present invention has broad utility and application. As should be understood, any embodiment may incorporate only one or a plurality of the above-disclosed aspects of the invention and may further incorporate only one or a plurality of the above-disclosed features. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. As should be understood, any embodiment may incorporate only one or a plurality of the above-disclosed aspects of the invention and may further incorporate only one or a plurality of the above-disclosed features. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

A disclosed solar power unit may be used in many situations. As a stand alone unit, the solar power unit may be a portable power source used to power an electronic device or charge a battery. The solar power unit may also be integrated into a building structure, for example, a residential deck or exterior wall, a commercial building exterior wall, or public structure, such as a cinderblock wall in a park or public club house, for generating a renewable power source.

Figure 1:
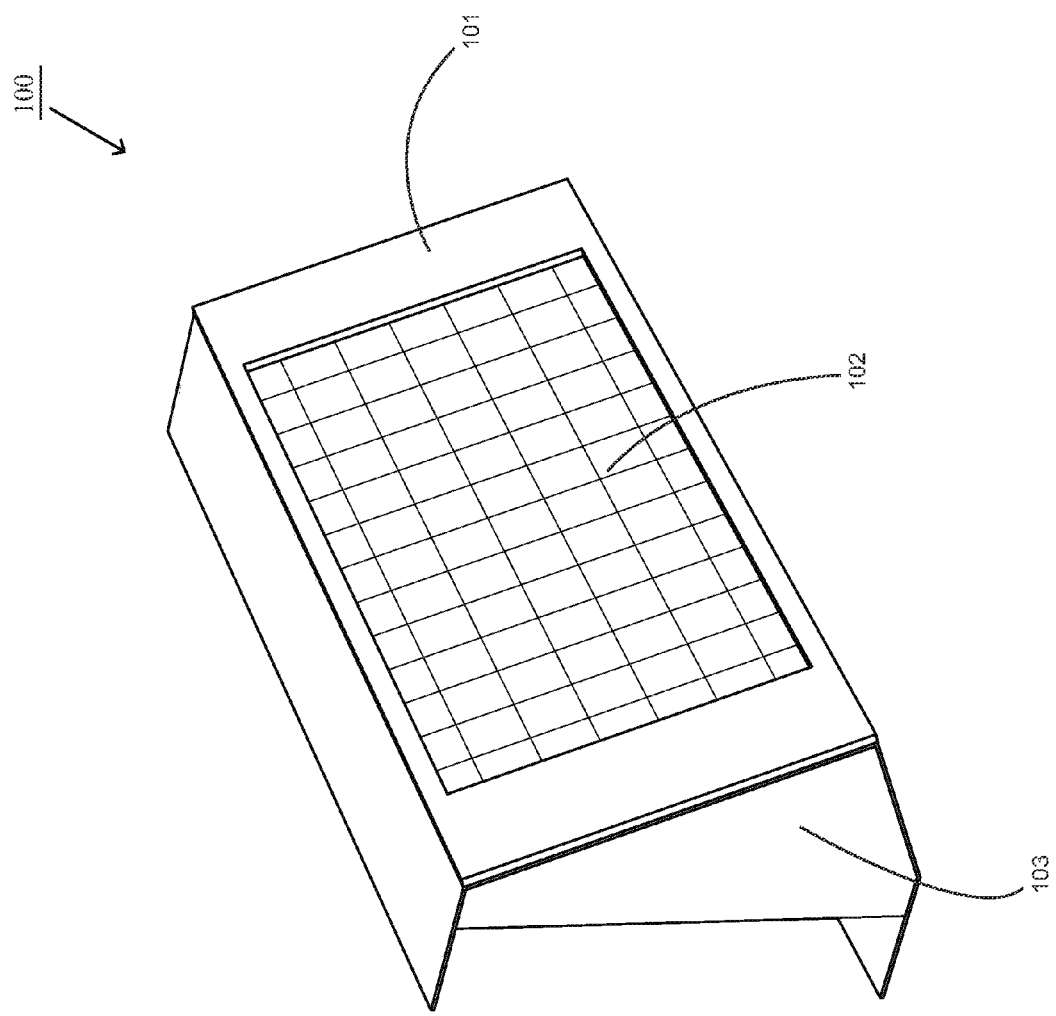
FIG. 1 is an example illustration of a disclosed solar power unit.

FIG. 1 is an example illustration of an implementation of a disclosed solar power unit 100. The solar power unit 100 comprises a solar panel 102, a frame 103 and a front cover 101. The solar panel 102, for example, a photovoltaic panel, converts the sun's solar energy to an electric signal, e.g., a direct current (DC) power signal.

Figure 4:
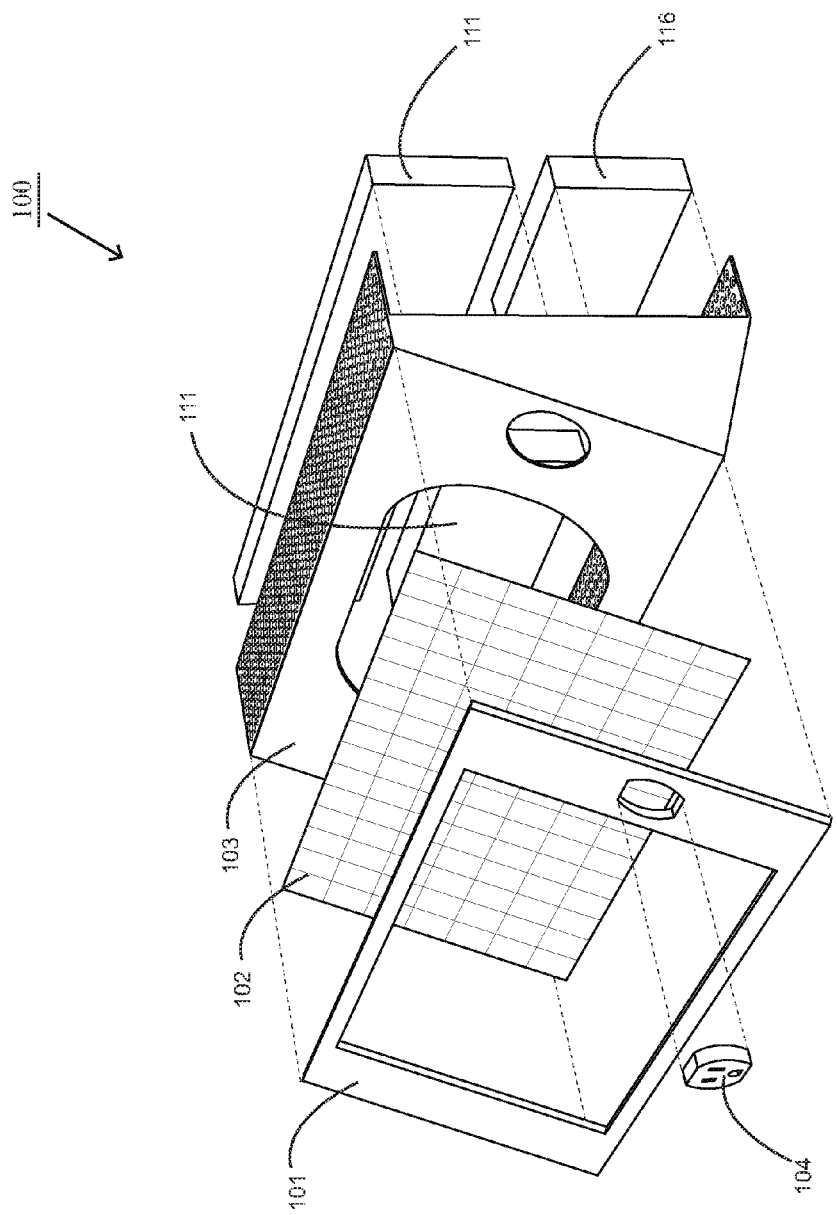
FIGS. 4 and 5 are example illustrations of exploded views of a frame in accordance with the disclosed solar power unit shown in FIG. 1.

In a preferred implementation, the solar panel 102 is supported in place within the front cover 101, preferably by slots or grooves on the rear of the front cover 101 that prevent the solar panel 102 from moving. Once the solar panel 102 is held within the front cover 101, the front cover 101 is be attached to the frame 103 preferably using screws, but any means of attaching the front cover 101 to the frame 103 can be used. The front cover 101 preferably may be removed and re-attached as required. Example illustrations of the frame 103 and front cover 101 are shown in FIGS. 4 and 5.

Figure 5:
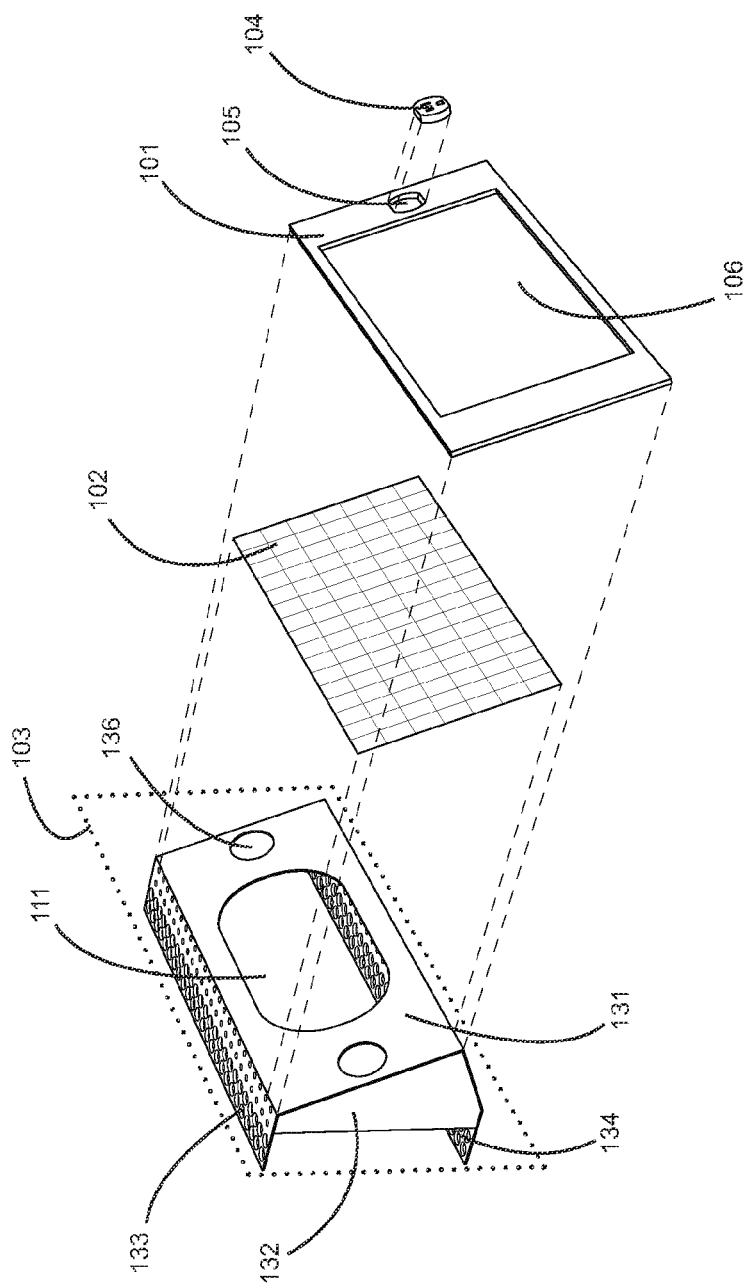

Referring to FIG. 5, the front cover 101 includes a panel opening 106 for allowing the solar panel 102 to receive the solar energy from the sun while the solar panel 102 and front cover 101 are attached to the frame 103. In a preferred solar power unit 100, the front cover 101 further includes a front cover output opening 105 for receiving a power output device 104, for example an electrical outlet, USB port, etc.

The frame 103 includes a front panel 131, a left and right side panel 132, a top panel 133 and a bottom panel 134. The front panel 131 includes an access opening 111 to allow a component, for example a charge controller, inverter, or power output device, to be coupled to the output of the solar panel 102, to be disclosed in greater detail below. In a preferred implementation, the front panel 131 further includes at least one power output device opening 136 for providing an opening to insert a power output device, wherein one of the at least one front panel output device openings 136 is lined up with the front cover output opening 105.

The left and right side panels 132 are attached to the left and right edges of the front panel 131. In accordance with the disclosed solar power unit 100, the right and left side panels 132 are shaped such that when attached to the front panel 131, the front panel 131 is positioned at an angle relative to the ground. The angle at which the front panel 131 is situated preferably depends upon the angle best suited to allow the solar panel 102 to receive as much of the sun's solar energy as possible, i.e., receive the most direct sun light for the longest period of time during the day. Those having skill in the art know that differing locations require different angles due to the sun's positioning in the sky over that location. This angle is referred to as the tilt angle.

Figure 2:
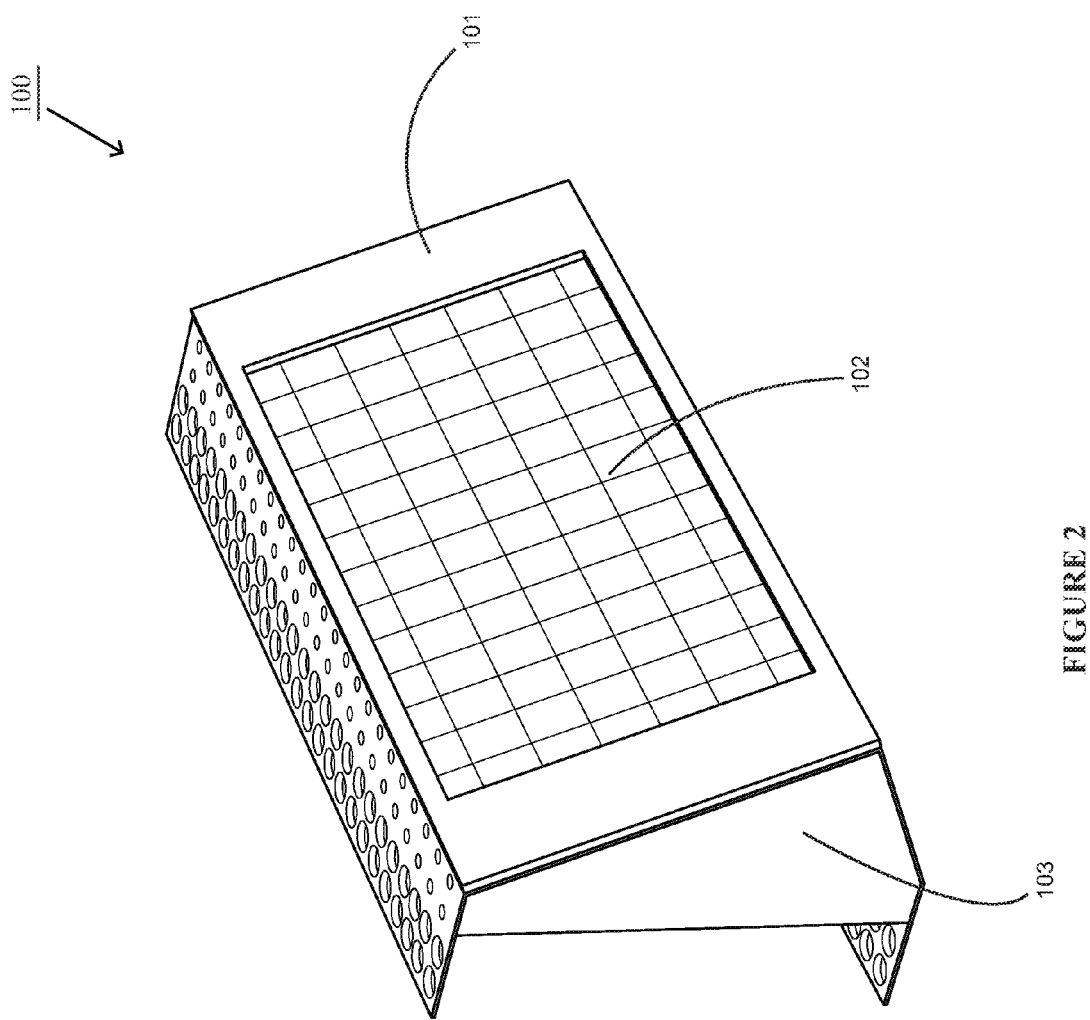
FIG. 2 is an example illustration of an alternative of the solar power unit shown in FIG. 1.
Figure 3:
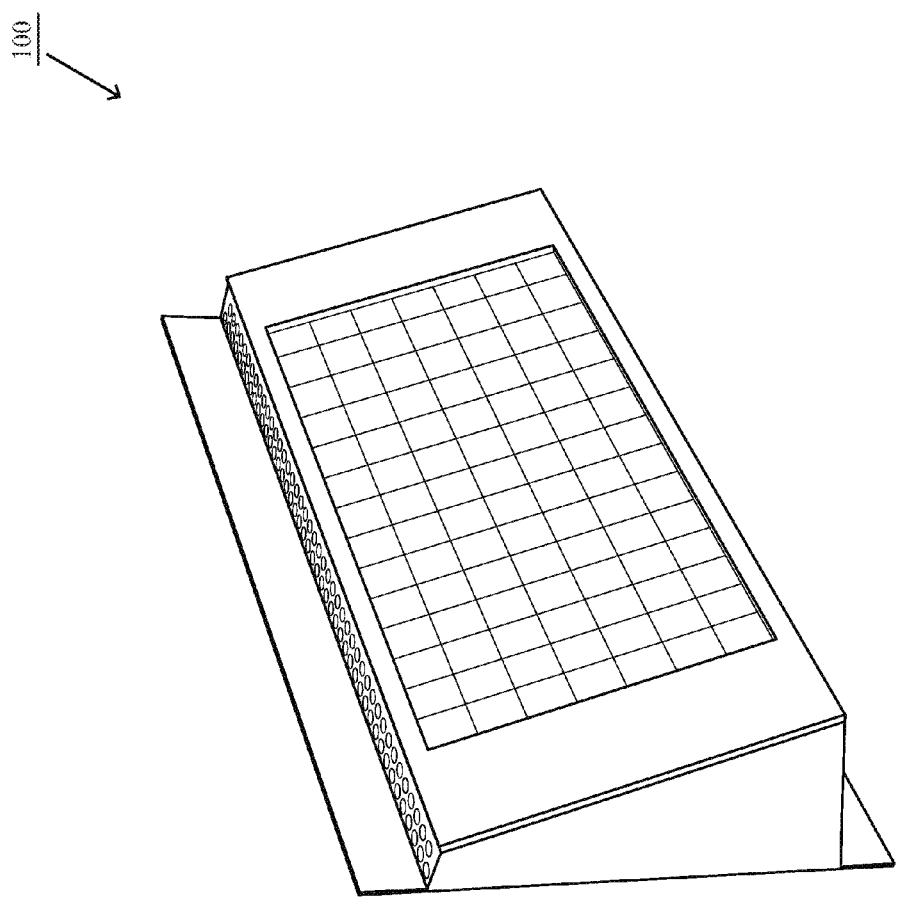
FIG. 3 is an example illustration of another alternative of the solar power unit shown in FIG. 1.

The top panel 133 is attached to the top edges of the front panel 131 and the right and left panels 132 such that the top panel 133 is parallel to the ground. Preferably, the top panel 133 is a flat piece of material that extends beyond the back edge of the right and left side panels 132. In a preferred implementation of the solar power unit 100, the top panel 133 is perforated, illustrated in FIG. 2, to be disclosed below. Alternatively, the material of the top panel 133 that extends beyond the back edge of the right and left side panels 132 may be bent upwards 90°, for example, such that the solar power unit 100 may be attached to an existing building structure, as illustrated in FIG. 3, to be disclosed in further detail below.

Referring back to FIG. 5, the bottom panel 134 is attached to the bottom edges of the front panel 131 and the left and right panels 132. In accordance with the disclosed solar power unit 100, and it alternatives, the bottom panel 134 is similar to the top panel 133.

Figure 6:
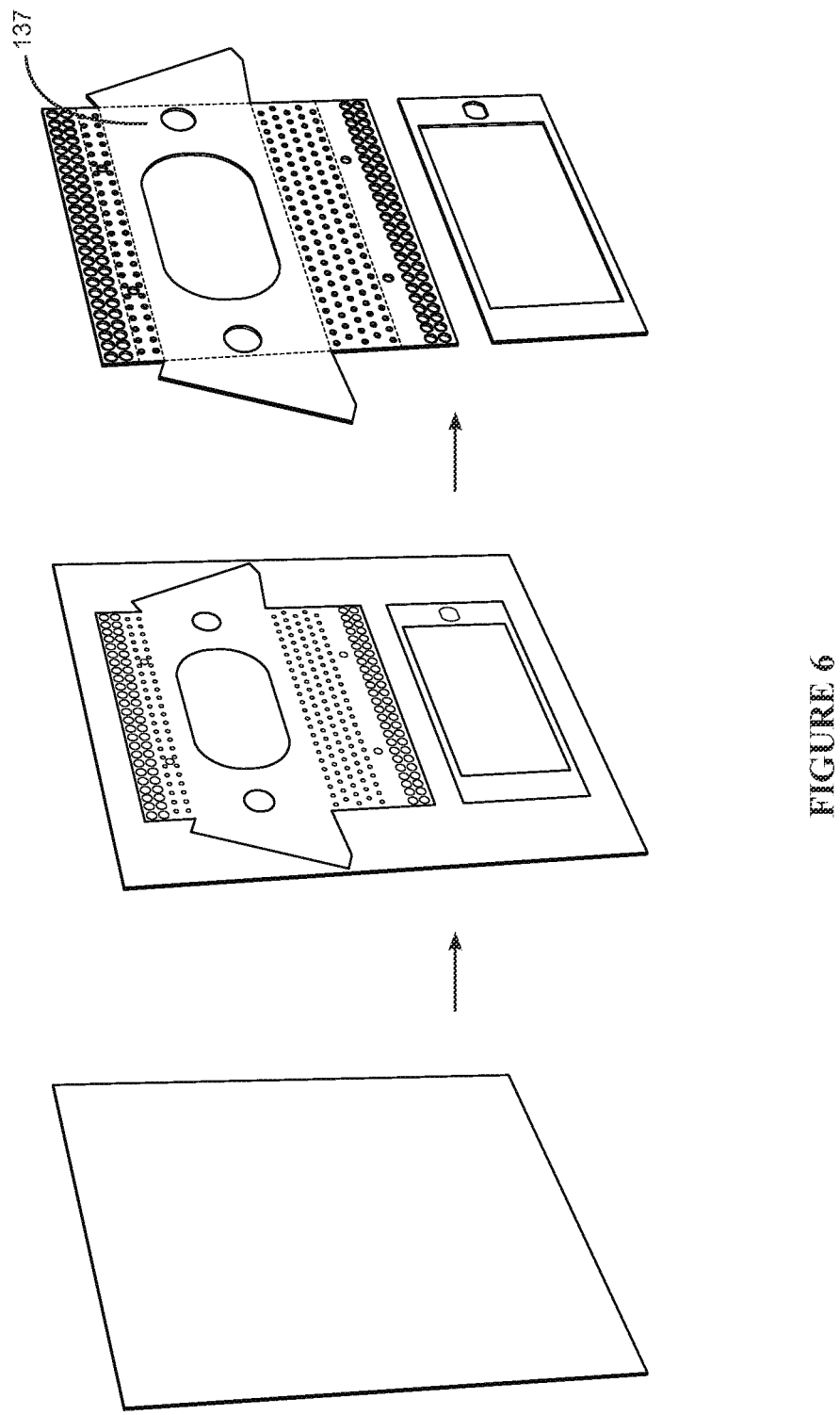
FIG. 6 is an example illustration of the fabrication of the disclosed frame of the disclosed solar power unit.

An example illustration of how the frame 103 of the disclosed solar power unit 100 may be fabricated is shown in FIG. 6. A flat panel made of any type of material for the frame and front cover may be used. In accordance with the disclosed solar power unit, the material of the frame and front cover is sheet metal, but other materials may be used, for example, plastic. A stencil of the frame and front cover are set on the flat panel and cut out. Once the frame and front cover are cut from the flat panel, the flat frame and flat front covers are cut and folded along the specified lines to form the frame and front cover used in the solar power unit.

Figure 7:
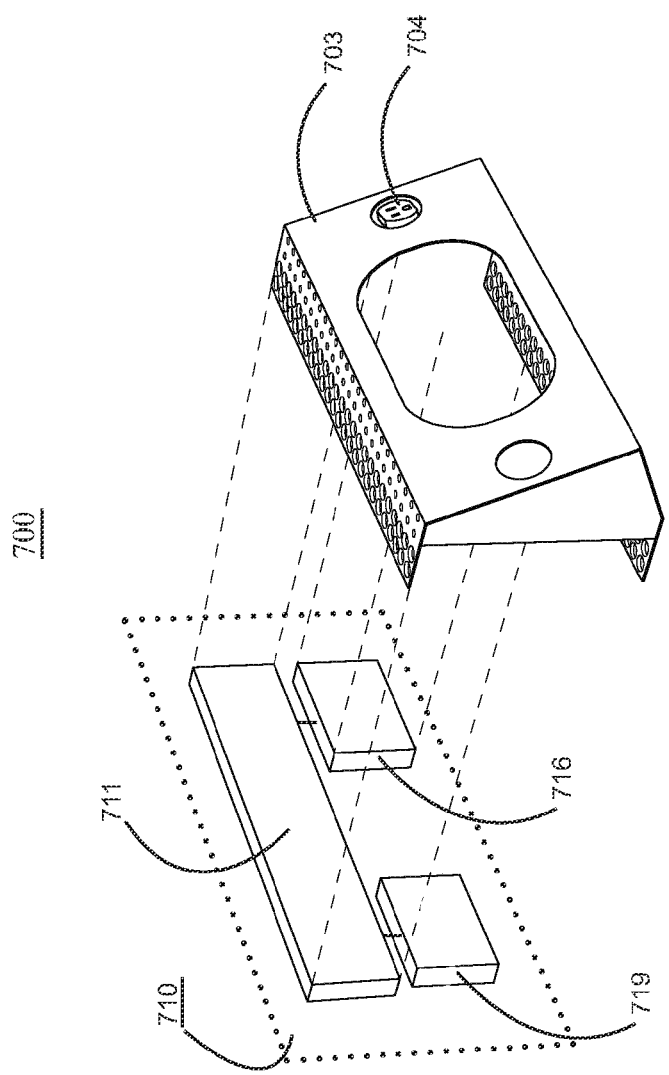
FIG. 7 is an example illustration of the disclosed solar power unit including a power component.

As stated above, the power signal generated by the solar panel may be coupled to a power component that utilizes the output power signal. FIG. 7 illustrates an example power component 710 included in the solar power unit 700. As a standalone solar power unit 700, the solar panel (not shown) may be coupled to the power component 710, which includes an inverter 716. The inverter 716 converts the received DC power signal from the solar panel to an AC power signal. In this implementation, a power outlet 704 is coupled to the power component 710. When an electronic device is plugged into the solar power unit 700, the generated AC power signal is used to power the electronic device.

In this implementation of the disclosed solar power unit 700, the power component 710 further includes a charge controller 719 and a battery 711. The charge controller 719, coupled to the solar panel 702 and the battery 711, receives the DC power signal generated by the solar panel 702 and forwards the DC power signal to the battery 711. The battery 711 then stores the DC power received for later use or forwards the signal to the inverter 716 when the power output device 704 is being used. The charge controller 719, as those having skill in the art know, also regulates the charging of the battery 711 to prevent over charging when the power generated by the solar power unit 700 is not being used by a device or other power sink.

The battery 711, coupled to the charge controller 719 and the inverter 716, stores the DC power generated by the solar power panel and forwards the stored DC power signal to the inverter 716. As disclosed above, the inverter 716 then converts the stored DC power signal to an AC power signal when the power output device 704 is being used. Although this implementation of the power component is disclosed as including a battery, charge controller and inverter, if should be noted that the power component may only include a battery or an inverter, with or without the other.

The power component 710 is preferably secured within the frame 703 of a standalone unit 700 by a back panel, not illustrated. Alternatively, the power component 710 may float within the frame 703.

As a standalone unit, the disclosed solar power unit may be used as a power source anywhere. With or without a power outlet, a device or battery may be coupled directly to the solar panel of the solar power unit through the back access opening of the frame and operated accordingly.

Figure 9:
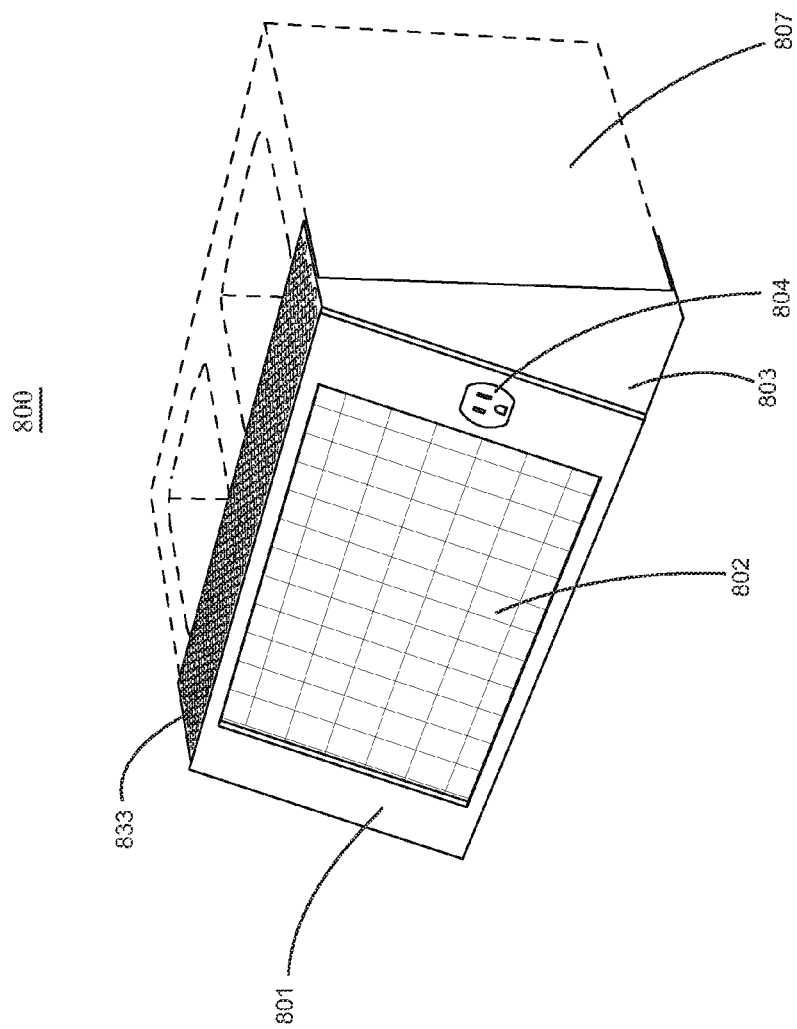
FIG. 9 is an example illustration of the disclosed solar power unit fitted over a cinder block.

In an alternative implementation of the disclosed solar power unit, the solar power unit may be integrated into an existing wall or building structure, or included in a new building structure as it is being built. For example, the solar power unit may be integrated into an existing exterior wall or other building or landscape structure, wherein the wall may be made up of building blocks. The building blocks may be made of any building material used for this purpose, for example, concrete, stone blocks, bricks, etc. For purposes of this disclosure, the building blocks are cinder blocks. As illustrated in FIG. 9, the frame 803 is fabricated to fit over the cinder block 807. Accordingly, the solar power unit 800 may be slid over a cinder block and used in a pre-existing or newly built wall.

Figure 8:
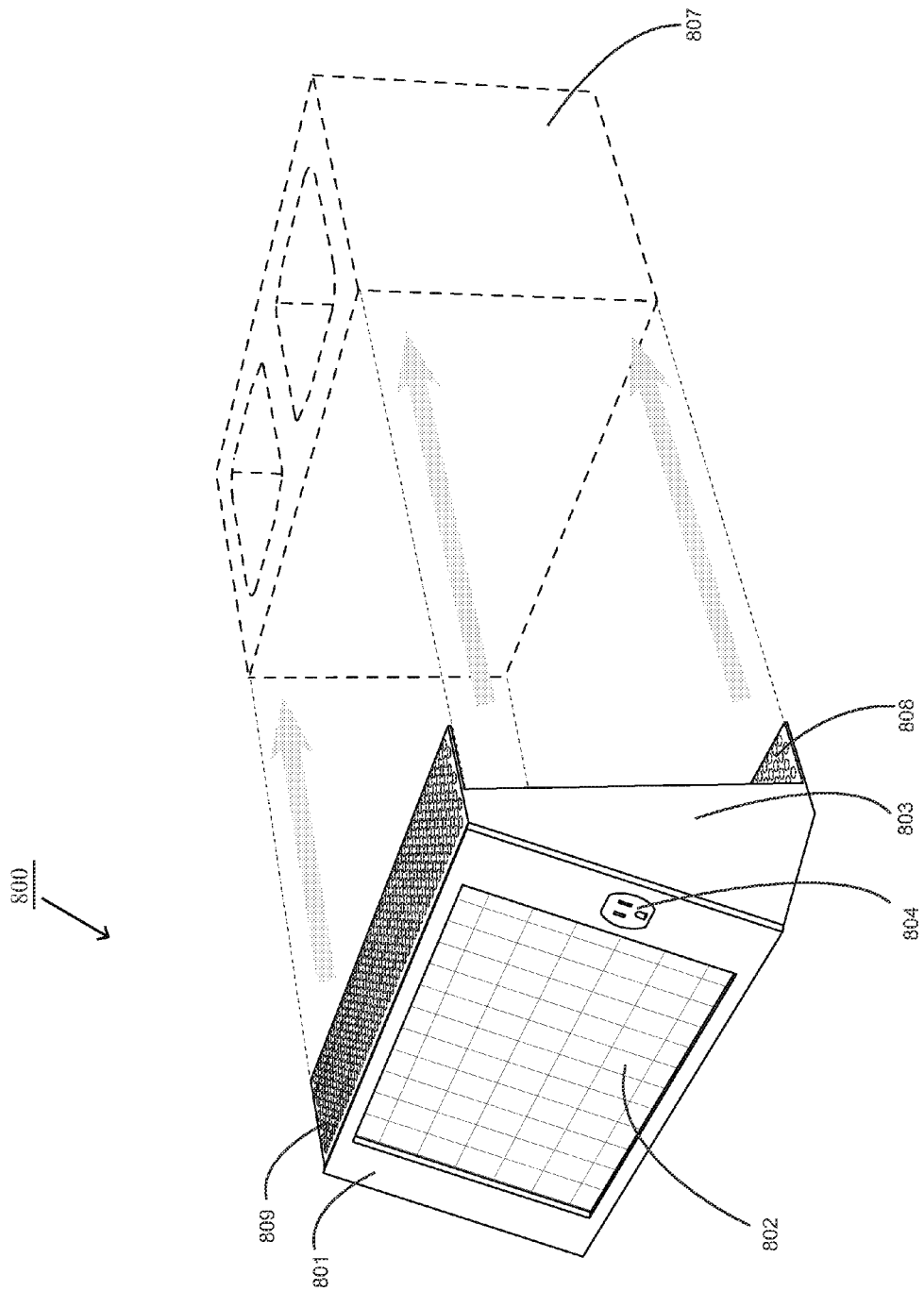
FIG. 8 is an example illustration of a method for integrating the disclosed solar power unit with a cinder block.

FIG. 8 illustrates an example method of integrating the disclosed solar power unit 800 with a cinder block 807. In accordance with this disclosed implementation, the frame 803 and the front cover 801 are designed to fit over a cinder block 807. The top and bottom panels 809, 808 are flat and preferably include perforations. The solar power unit 800 also includes a battery and inverter, not shown. A power output source 804 is coupled to the inverter, receives the AC power signal from the inverter, and provides power to a device coupled to the power output source 804, e.g., an electronic device.

In an implementation, the solar power unit 800 may be installed by sliding the frame 803, including the solar panel 802 and front cover 801, over the cinder block 807 such that the top and bottom panels 809, 808 are covering a portion of the top and bottom of the cinder block 807. In accordance with this implementation, the battery and inverter are situated within the frame 803 such that when the cinder block 807 is slid into the frame 803, the battery and inverter are housed freely between the front panel (not shown) and the front of the cinder block 807. Alternatively, a back panel may be included in the frame 803 such that the top and bottom panels 809, 808 hang over the back panel and the cinder block 807 slides against the back panel.

Figure 10:
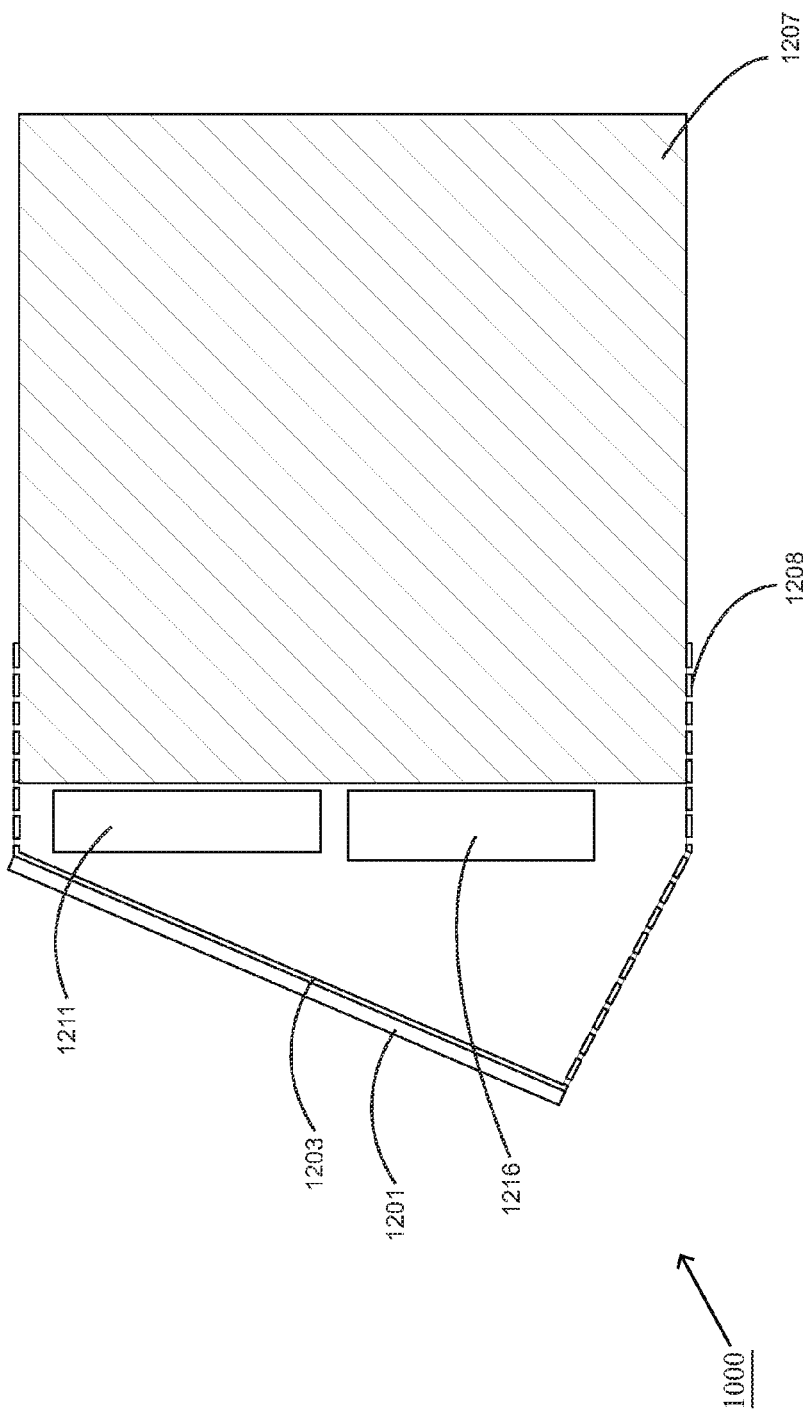
FIG. 10 is an example illustration of a cross-sectional view of the solar power unit shown in FIG. 9, including a power component.

As disclosed, the top and bottom panels 809, 808 are perforated such that when cinder blocks are placed above and below the integrated solar power unit 800, the bonding material used to build the wall, i.e., mortar, may still bond with the cinder block 807 while within the frame 803. An example illustration of this disclosed implementation is shown in FIG. 10.

Figure 14:
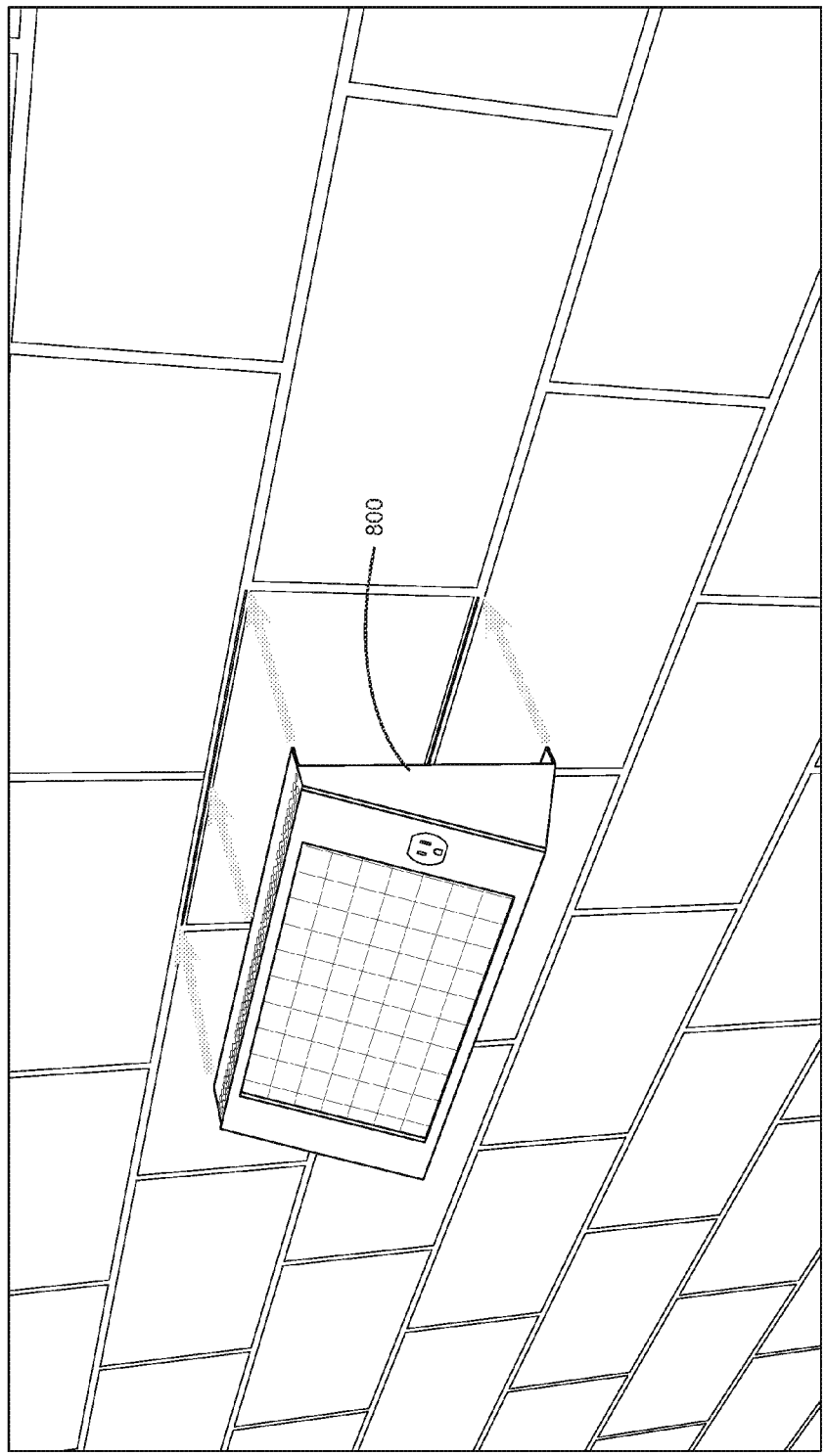
FIG. 14 is an example illustration of a method for integrating the disclosed solar power unit within an existing wall.

This implementation of the solar power unit may also be integrated into an existing wall wherein the frame of the solar power unit is slid into cutouts in the existing building structure, such as an exterior concrete wall. An example illustration of this implementation can be seen in FIG. 14.

Figure 11:
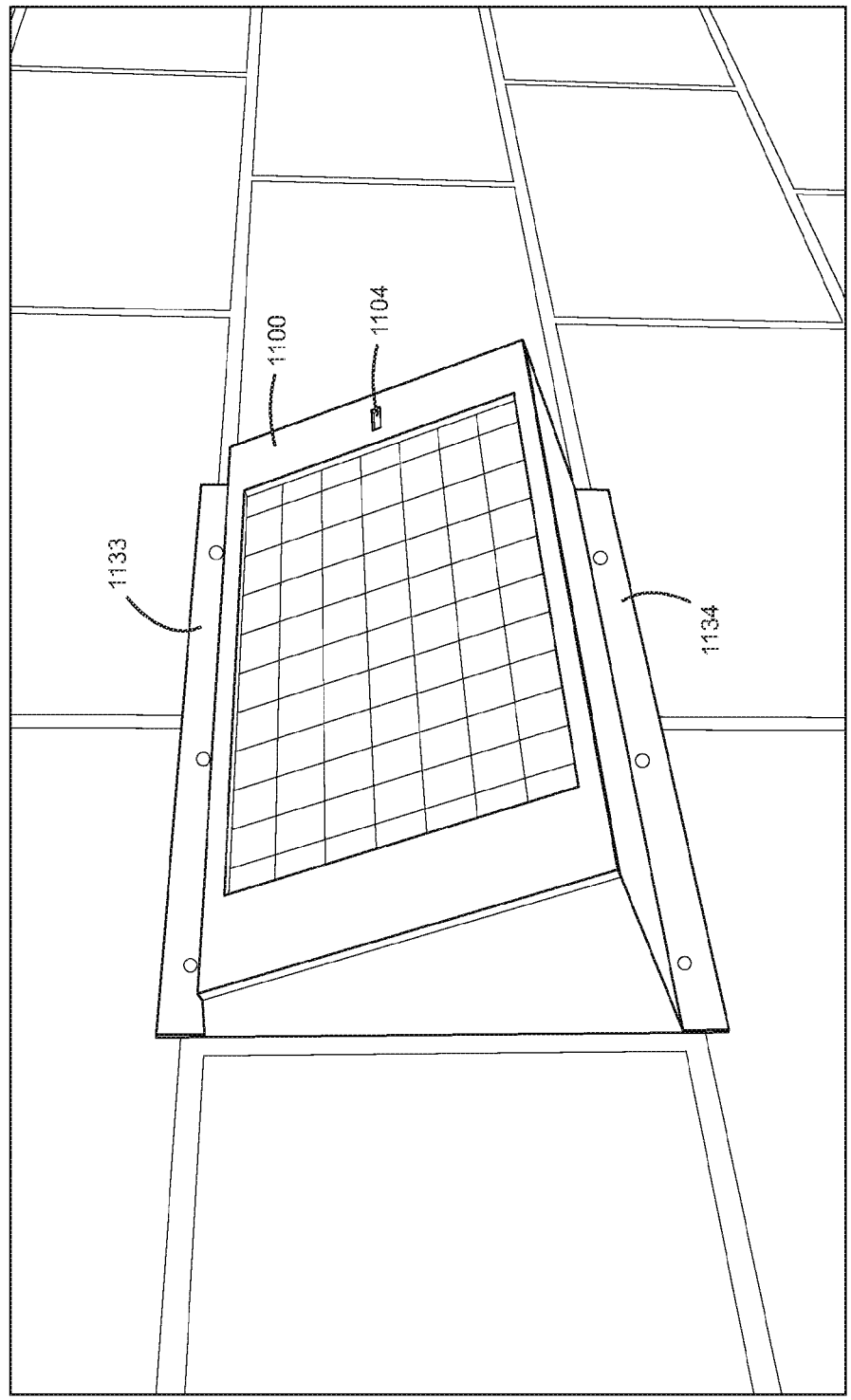
FIG. 11 is an example illustration of the alternative implementation of the disclosed solar power unit installed on a pre-existing wall.

Further, the alternative solar power unit illustrated in FIG. 3 may be installed on a preexisting wall as well. In accordance with this implementation, the top and bottom panels are bent to allow the solar power unit to be attached to a building structure. In FIG. 11, the building structure is a pre-existing cinder block wall. Once attached to the wall, the power output source 1104 may be used to power an electronic device.

Figure 12:
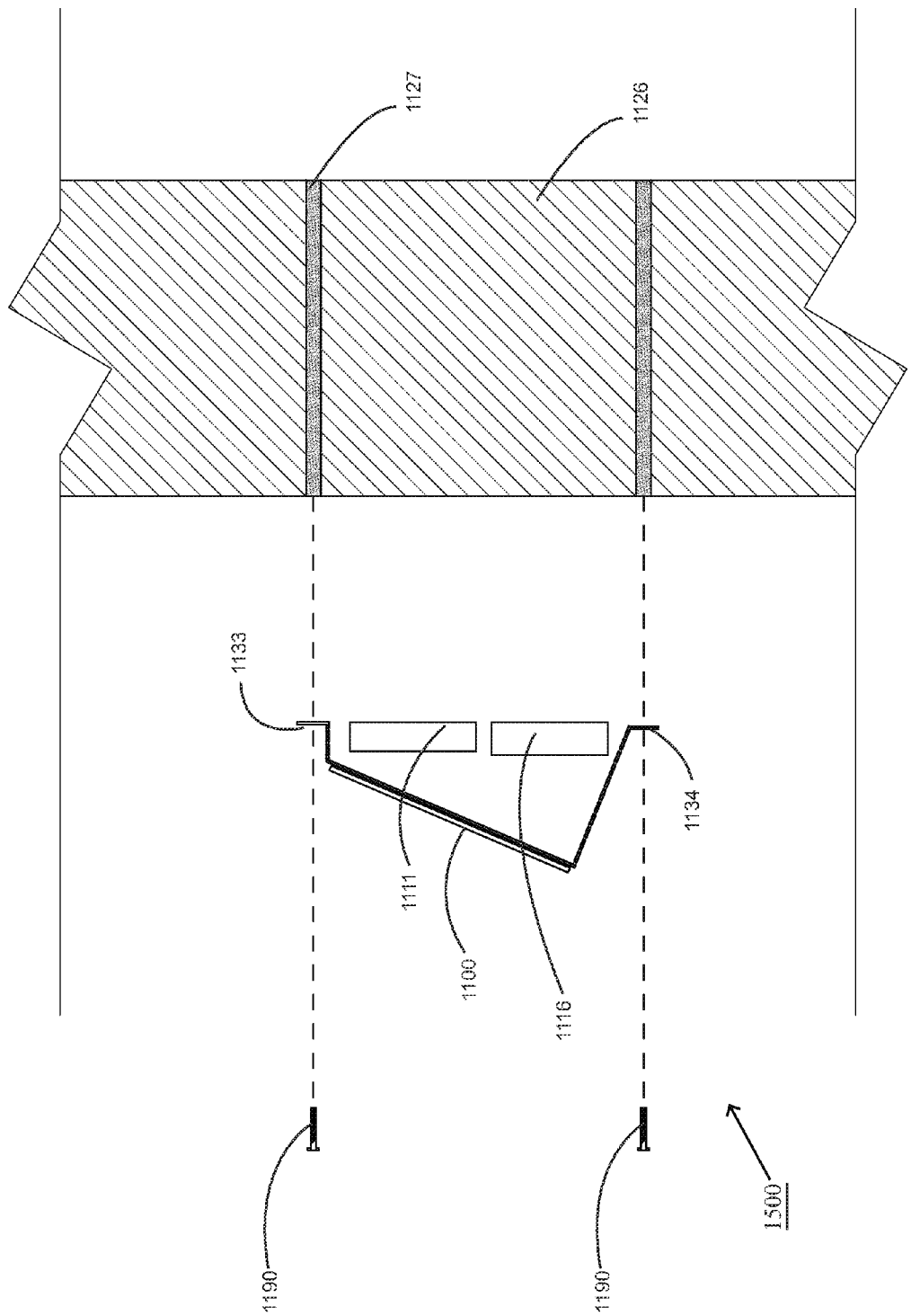
FIG. 12 is a cross-sectional view of the alternative solar power unit shown in FIG. 11.
Figure 13:
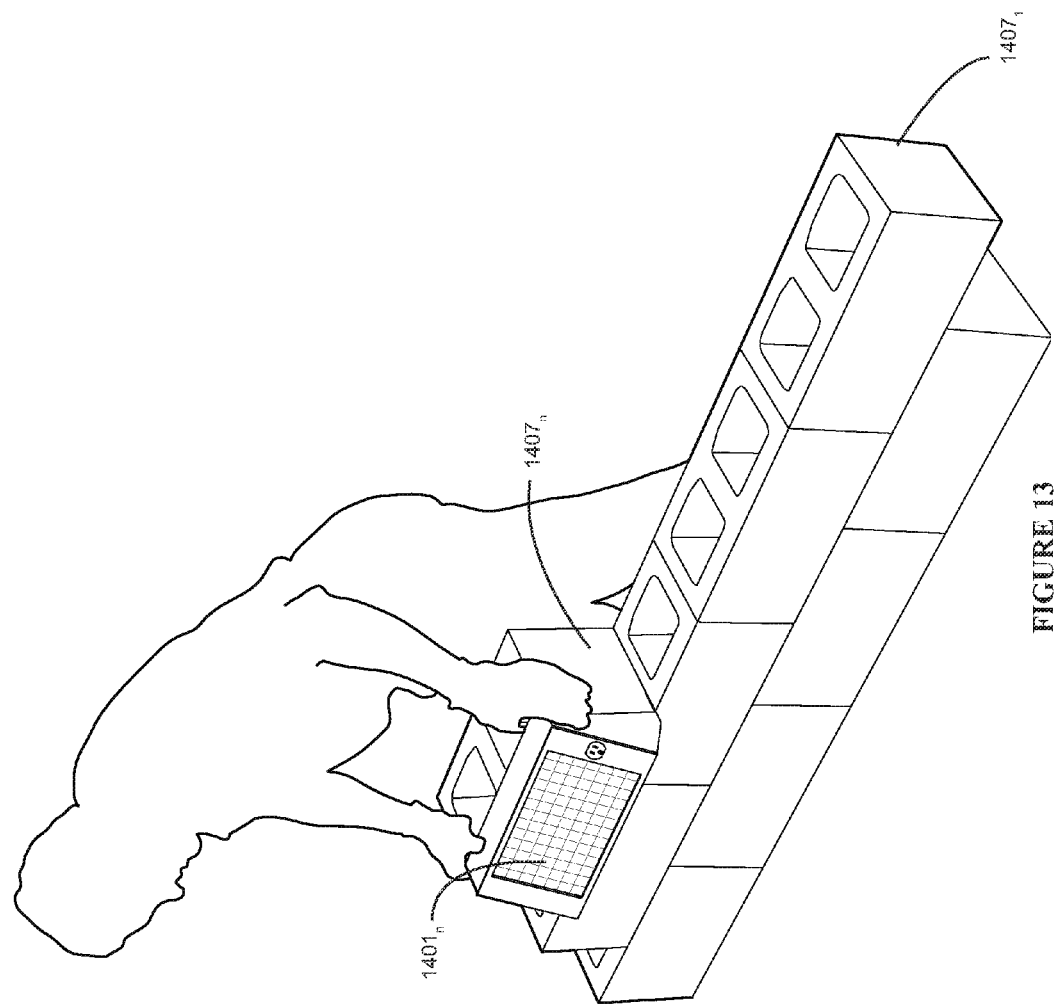
FIG. 13 is an example illustration of a method for integrating the disclosed solar power unit into a wall being built.

Referring to FIG. 12, a cross-sectional view of the solar power unit illustrated in FIG. 11, it is preferable that the solar power unit 1100 includes a battery 1111 and inverter 1116, as described above. As illustrated in FIG. 12, the solar power unit 1100 may be attached to the existing wall using screws 1190. Accordingly, the screws 1190 are drilled through the top 1133 and bottom 1134 panels and into the mortar 1127 between each cinder block 1126. Although screws have been disclosed as the manner for attaching the alternative solar power unit to an existing wall, other means know to those having skill in the art may be used, e.g., an adhesive glue or tape.

Figure 15:
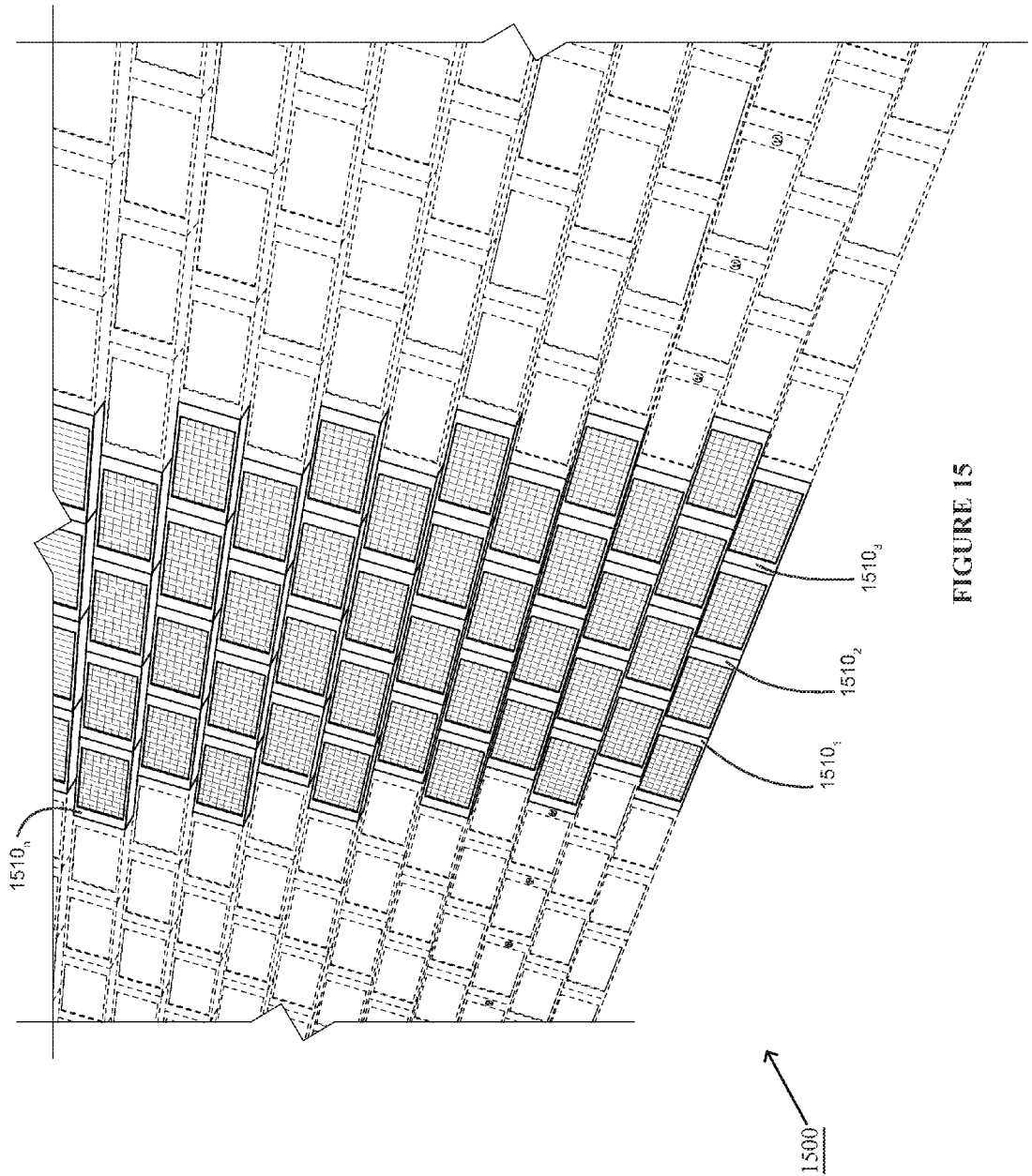
FIG. 15 is an example illustration of a disclosed solar power system including a plurality of solar power units.

In another disclosed implementation, a plurality of solar power units are included in a solar power system, as illustrated in FIG. 15. As illustrated, solar power system 1500 comprises a plurality of solar power units $1510_1 \ldots 1510_n$. The solar power system 1500 may provide power to the building in which the wall supports or to any devices that may be able to connect thereto. This solar power system 1500 therefore may or may not include a storage device, depending on the purpose of the system 1500. As such, the power being generated by the solar power system 1500 and not used by the building, may then be sold to the electric power company, providing the owner of the building with an additional income stream.

Figure 16:
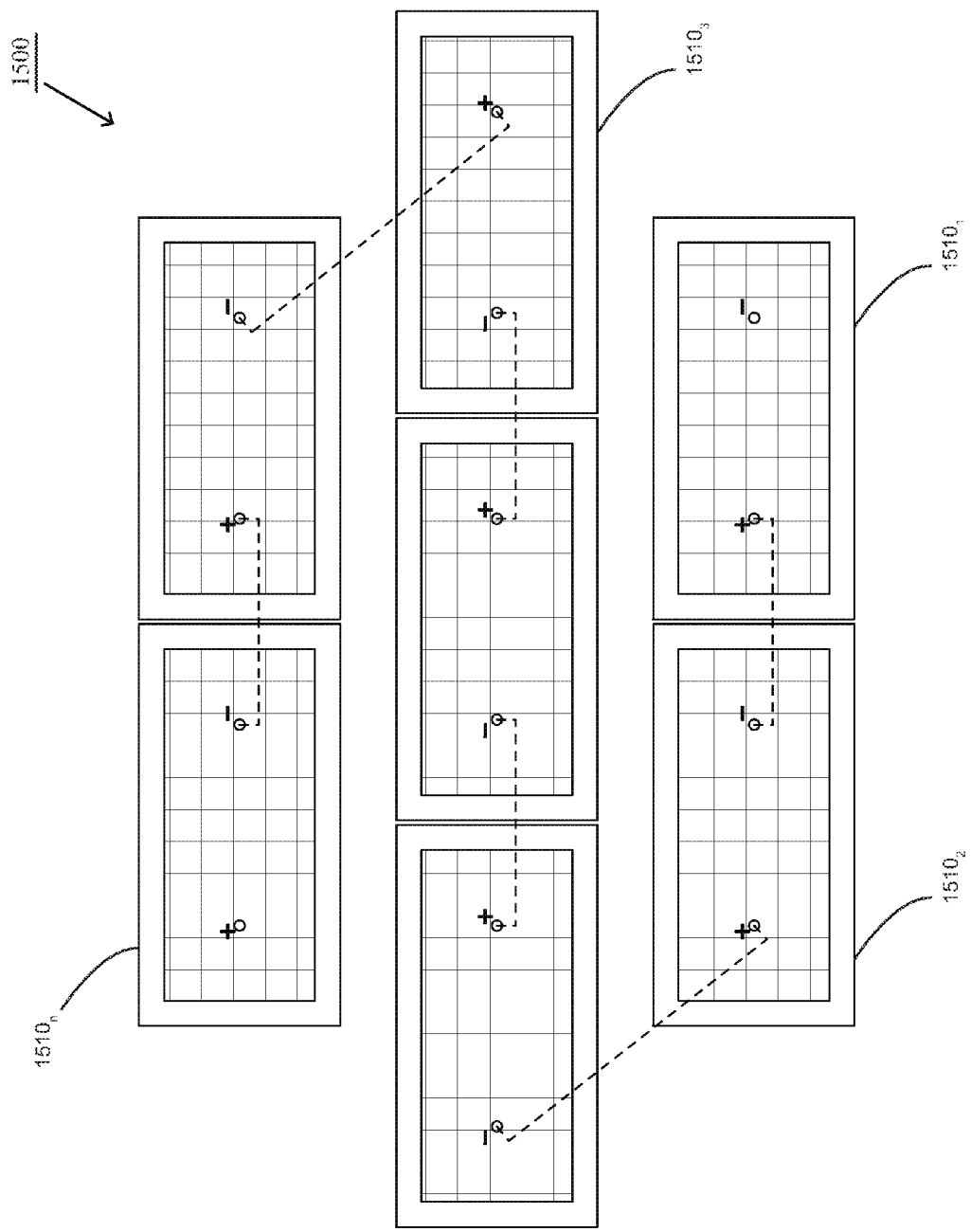
FIG. 16 is an example circuit diagram of the disclosed solar power system shown in FIG. 15 wherein the plurality of solar power units are connected in series.

Each solar power unit 1510 in the disclosed implementation may be coupled to one another in series or parallel, depending on the implementation. For example, if the solar power system was being used as a power source to a building, the solar power units $1510_{1...n}$ may be electrically coupled in series. An example circuit diagram of serially connected solar power units 1510 can be seen in FIG. 16.

Figure 17:
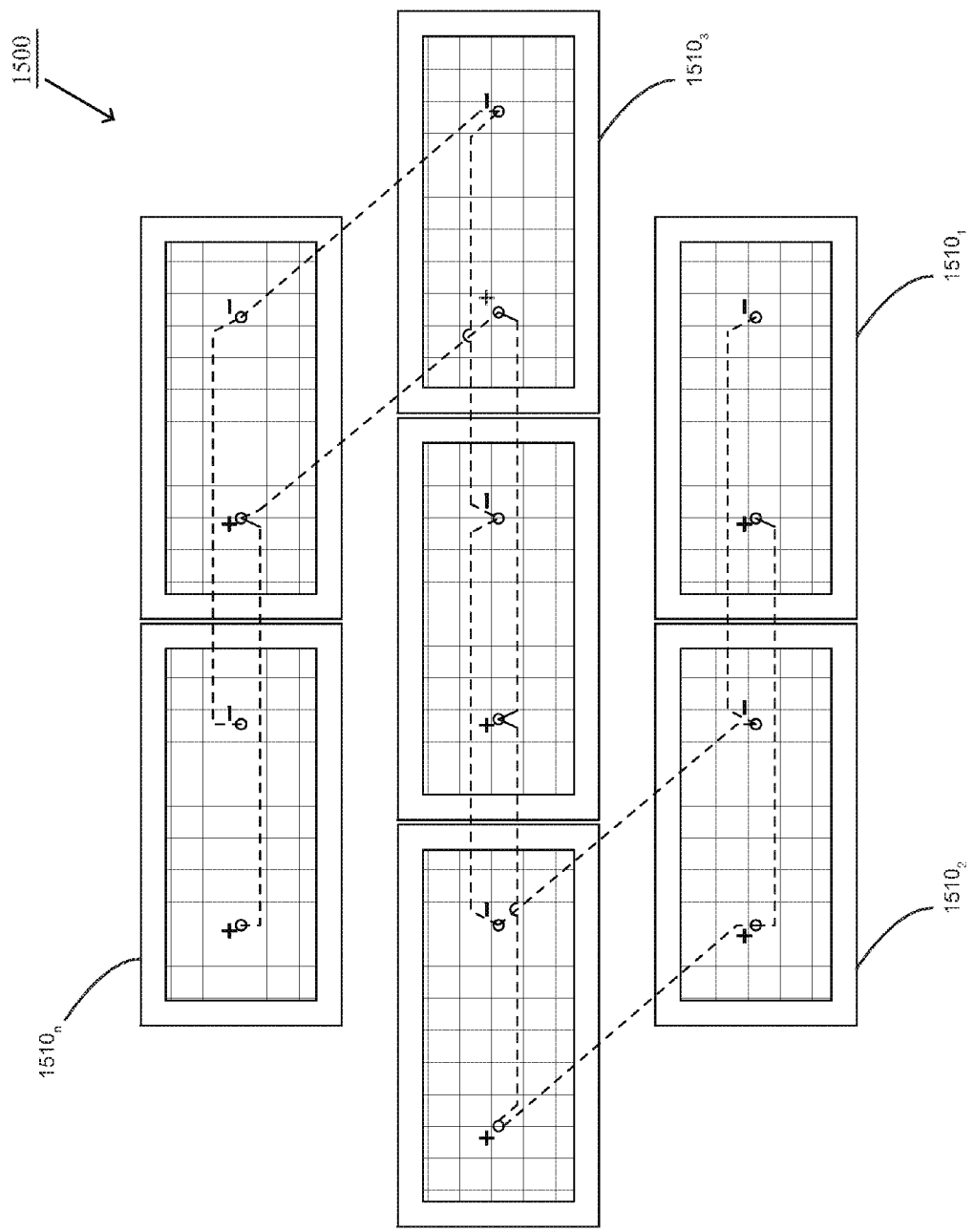
FIG. 17 is an example circuit diagram of the disclosed solar power system shown in FIG. 15 wherein the plurality of solar power units are connected in parallel.

Referring back to FIG. 15, if the solar power system 1500 was to provide more than a single source of power, the solar power system 1500 may be sectioned off such that the groups of the plurality of solar power units 1510 are electrically coupled in parallel to one another. An example circuit diagram of this implementation can be seen in FIG. 17.

Figure 18:
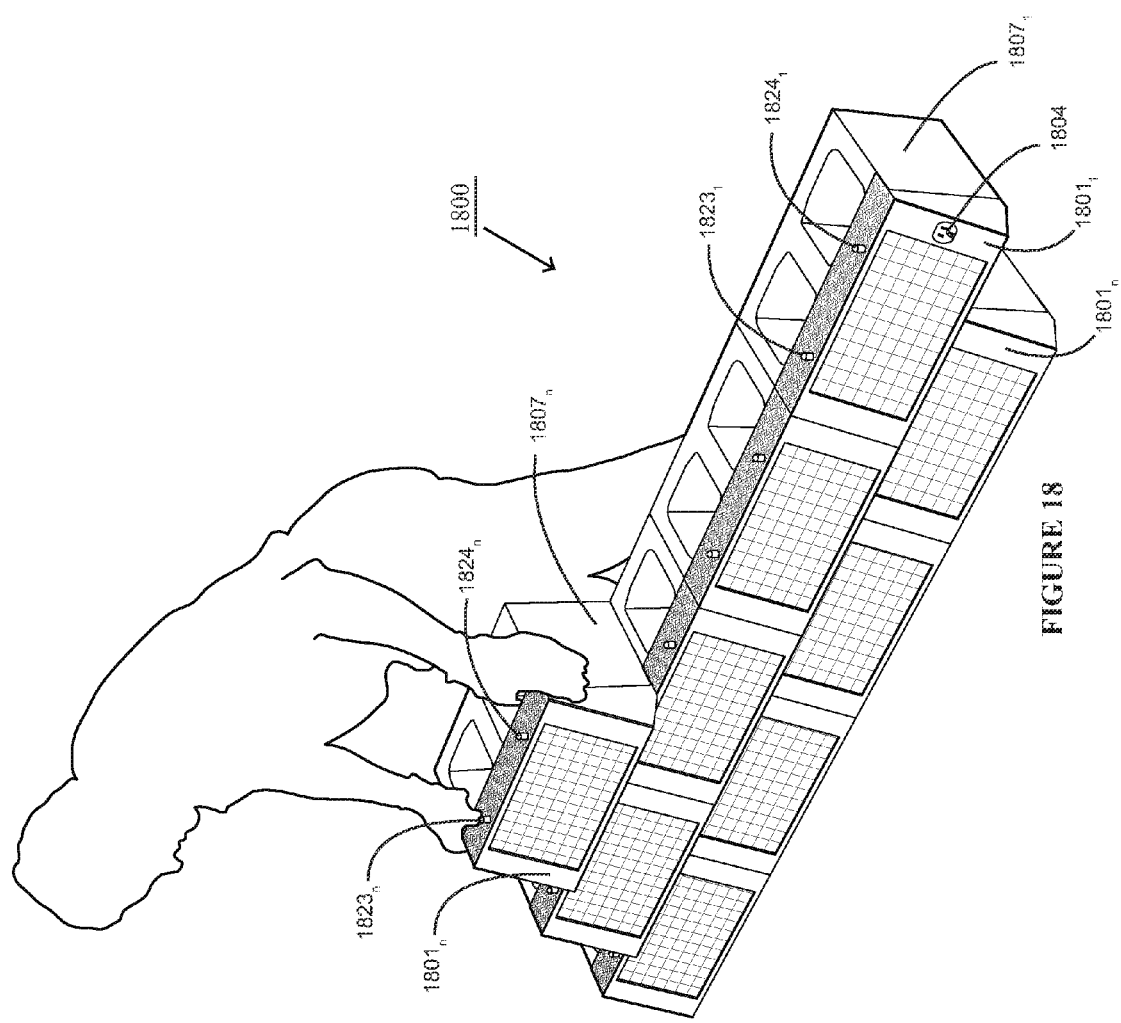
FIG. 18 is an example illustration of the building of a cinder block wall including the disclosed solar power units.

FIG. 18 illustrates an example solar power system 1800 including a plurality of alternative solar power units $1801_{1...n}$. Each solar power unit 1801 includes a positive lead (+) 1823 and negative lead (−) 1824. An example solar power unit in accordance with this implementation is illustrated in FIG. 19.

Figure 19:
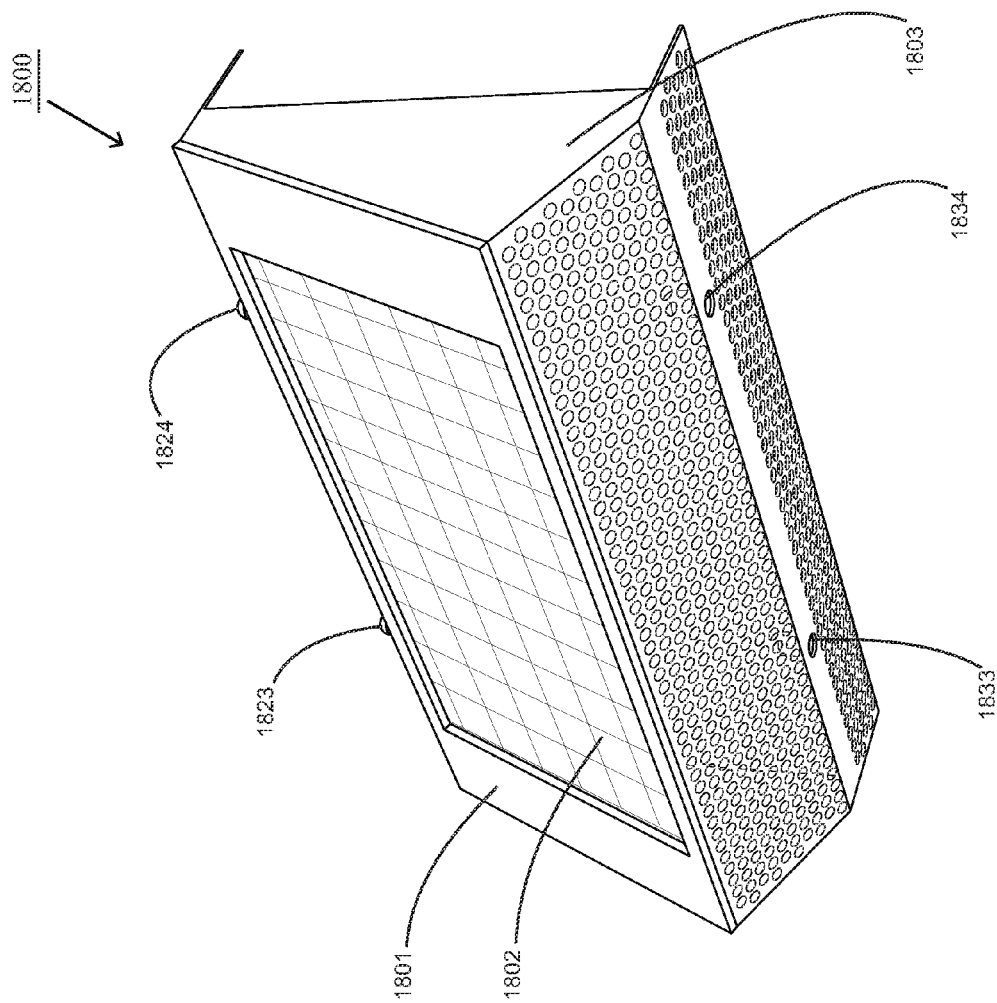
FIG. 19 is an example illustration of the alternative solar power unit, including a positive and negative leads and lead cavities.

As illustrated in FIG. 19, the solar power unit 1800 comprises lead cavities 1833 and 1834 and a positive lead 1823 and negative lead 1824. In accordance with this disclosure, lead cavities 1833 and 1834 are female connectors for additional solar power units 1800 to electrically connect to one another as shown in FIG. 18.

Figure 20:
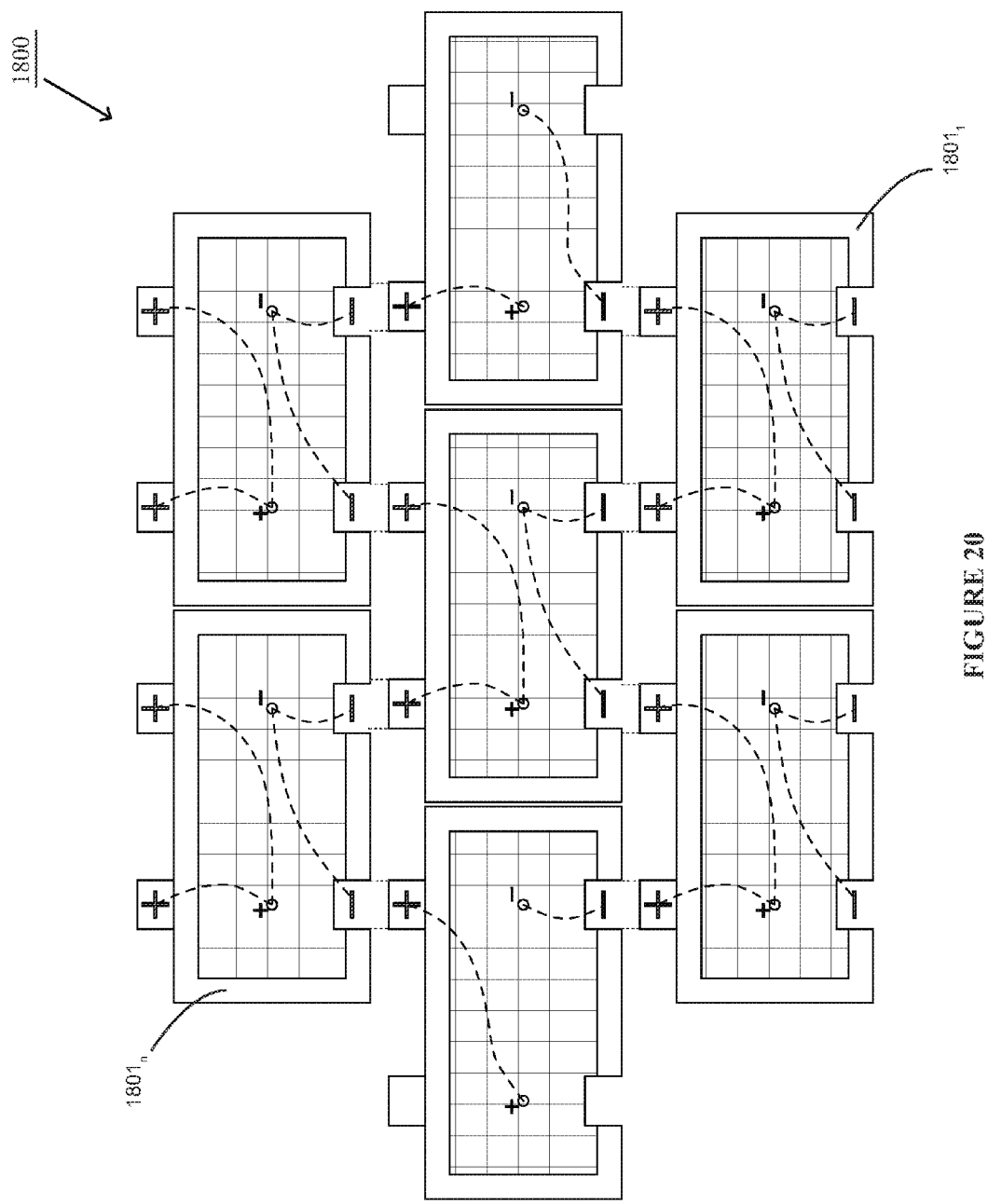
FIG. 20 is an example circuit diagram of the solar power system of FIG. 18, wherein the plurality of solar power units are connected in series.
Figure 21:
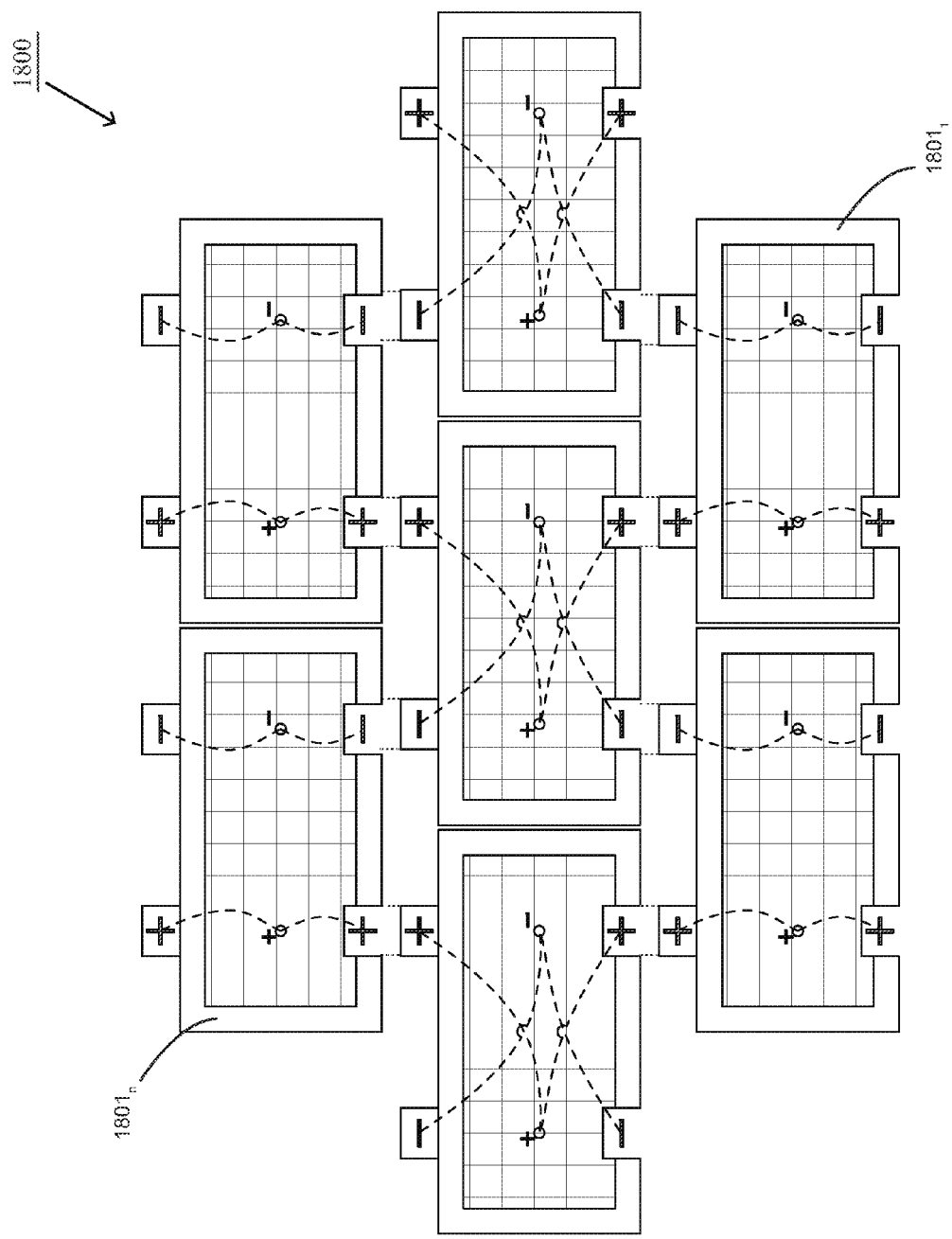
FIG. 21 is an example circuit diagram of the solar power system of FIG. 18, wherein the plurality of solar power units are connected in parallel.

Referring back to FIG. 18, each of a plurality of solar power units $1801_n$ in the solar power system 1800 may be coupled to a solar power unit $1801_n$ above it through its positive lead $1823_n$ or negative lead $1824_n$, and below the unit through the lead cavities. As disclosed above, depending on how the energy generated by the solar power system may be coupled to one another in series or parallel. Example circuit diagrams of the solar power units 1801 connected in series and parallel in accordance with this disclosed implementation are illustrated in FIGS. 20 and 21, respectively.

Figure 22:
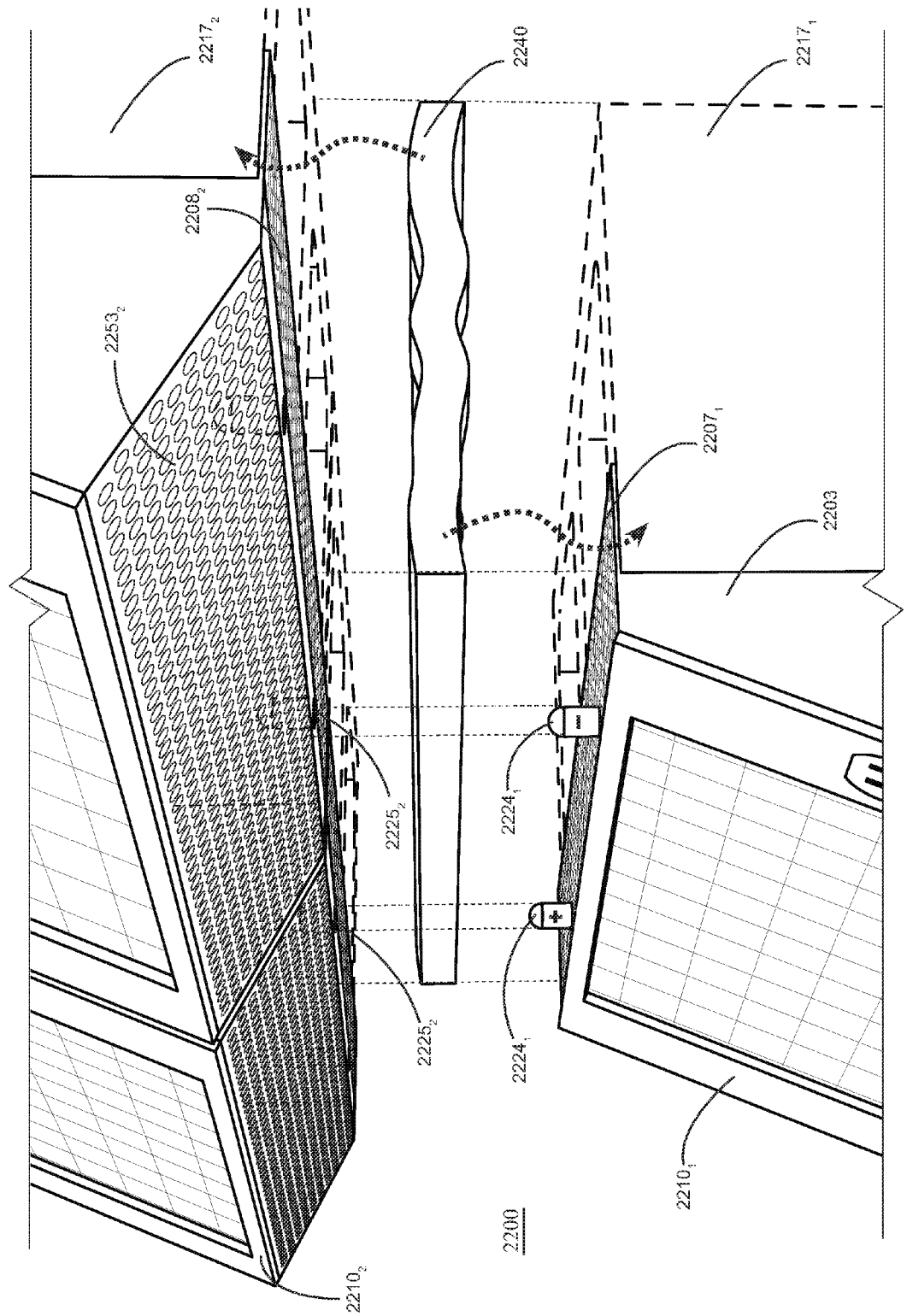
FIG. 22 is an example illustration of a method for installing the solar power units into a new wall.

In accordance with this implementation, each solar power unit 2210 of the solar power system 2200 may be installed as illustrated in FIG. 22. As illustrated in FIG. 22 and disclosed above, the frame 2203 includes a perforated top and bottom panel 2207, 2208, respectively. Once the lower section of the wall is installed including the solar power unit $2210_1$, mortar or other bonding substance 2240 can be spread over the cinder block $2217_1$. Because the top panel $2207_1$ is perforated, the bonding material is able to adhere to the cinder block $2217_1$.

The solar power unit $2210_2$ is then installed on top of the solar power unit $2210_1$. Again, because the bottom panel of the solar power unit $2210_2$, the bonding substance 2240 is able to bond to the cinderblock $2217_1$. Depending on the how the solar power units 2210 are electrically connected, the lead $2224_1$, $2223_1$ are connected to lead cavity(ies) $2233_2$, $2234_2$ accordingly.

In this implementation, it is a preferred feature to include additional perforations $2253_2$ in the angled portion of a solar power unit's $2210_2$ bottom panel $2208_2$. Similarly, perforations may be added to the portion of the top panel $2210_1$ that is not engaged with the cinder block $2217_1$ of this disclosed implementation. The inclusion of these perforations allow air to flow through the solar power units 2210 to cool the solar power unit 2210 and assist in drying the unit 2210 after wet weather.

Figure 23:
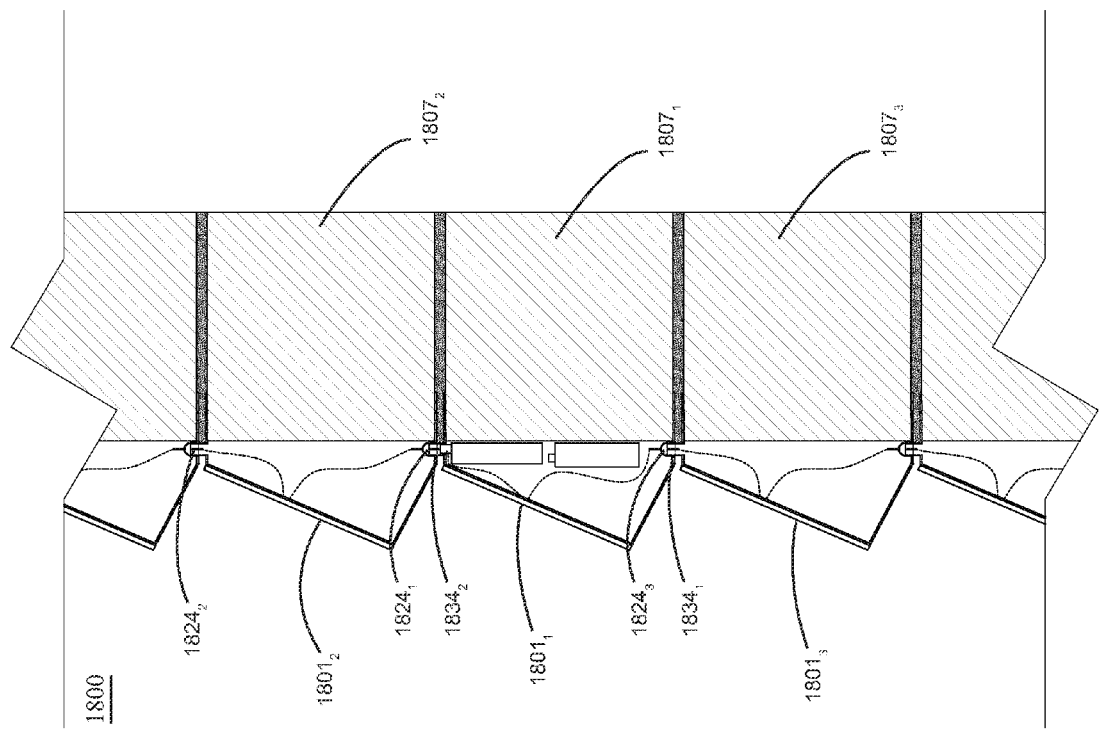
FIG. 23 is an example illustration of a cross-sectional view of the disclosed solar power unit shown in FIG. 18.

FIG. 23 illustrates a cross-sectional view of the disclosed solar power system in a building structure shown in FIG. 18, including a plurality of building blocks $1807_1$, $1807_2$, $1807_3$. As shown in FIG. 23, solar power units $1800_1$, $1800_2$, $1800_3$ are each slid over building blocks $1807_1$, $1807_2$, $1807_3$, and electrically connected to each other at leads $1824_1$ and $1824_3$ through lead cavities $1825_1$ and $1825_2$.

FIG. 18 also illustrates the building of a building structure 1800 including a plurality of building blocks $1807_1 \ldots 1807_n$, and a plurality of solar power units $1801_1 \ldots 1801_n$ electrically connected to one another to provide power to electrical outlet 1804 included in solar power unit $1801_1$. Once the building structure is complete, a user may then connect an electronic device, requiring a DC power source, to be powered through outlet 1804 of solar power unit $1801_1$, using the power generated by the plurality of solar power units $1801_1 \ldots 1801_n$.

Figure 24:
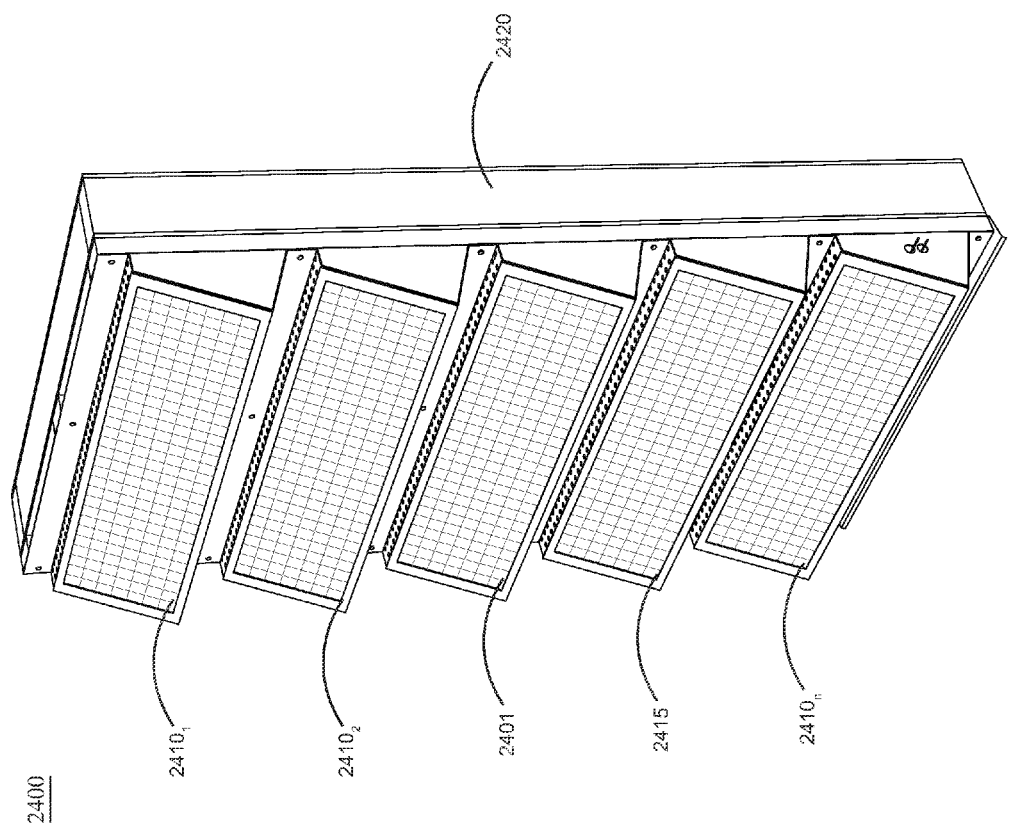
FIG. 24 is an example illustration of a disclosed solar wall module.

In accordance with an alternative implementation, a solar wall module is disclosed. FIG. 24 illustrates an example solar wall module 2400 in accordance with this implementation. The solar wall module 2400 comprises a plurality of solar power units $2410_{1...n}$ and wall assembly 2420. As disclosed above, the solar power unit 2410 may include top and bottom panels that are bent 90° up and down, respectively, such that the solar power units can be attached to an existing wall. In accordance with this implementation, each of the plurality of solar panel users are attached to the wall assembly for integrating with a building wall.

Figure 25:
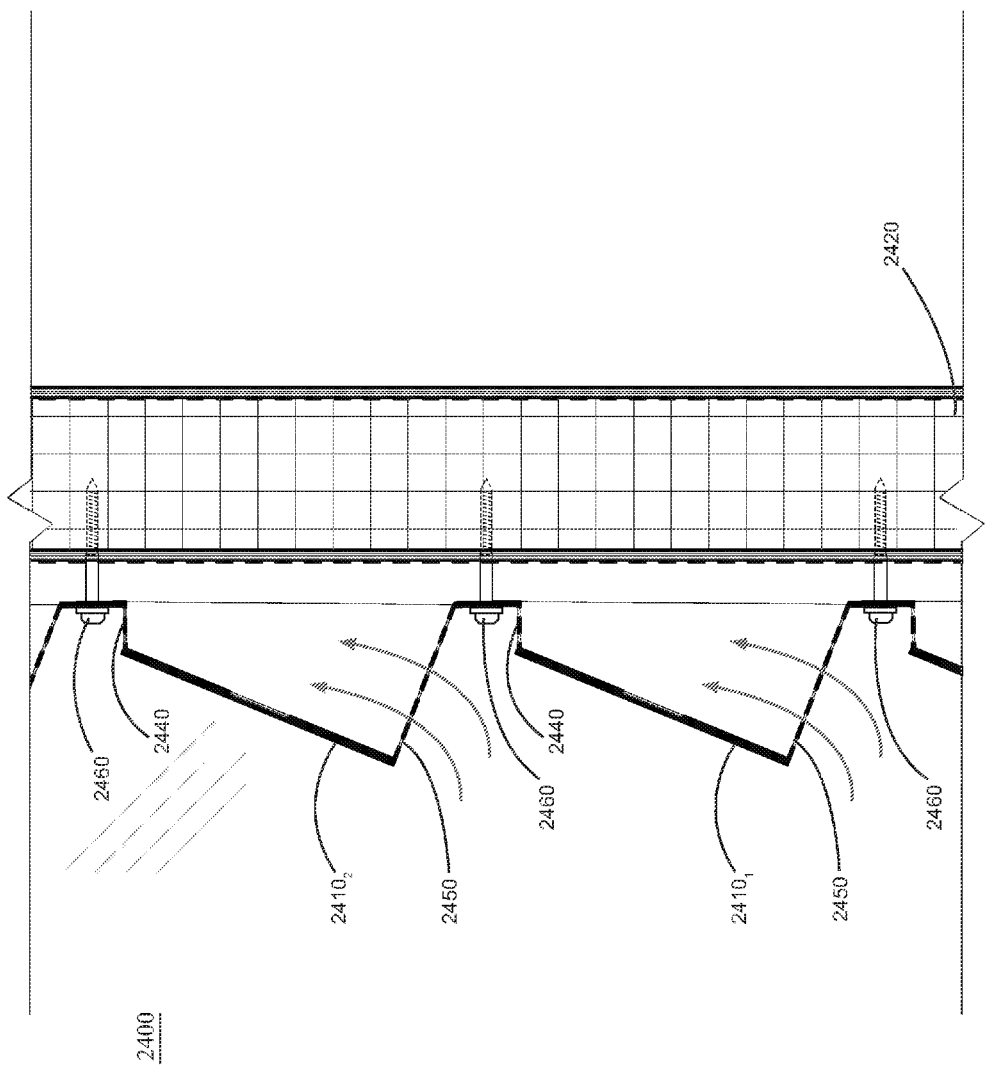
FIG. 25 is an example illustration of a cross-sectional view of the solar wall module shown in FIG. 24.

An example cross-sectional illustration of the solar wall assembly 2400 is shown in FIG. 25. As illustrated in FIG. 25, the solar power units 2410 are attached to each other and to the wall assembly 2420 using screws 2460. Although screws have been disclosed, it should be noted that any means of supporting the plurality of solar power units on the wall assembly may be used.

Figure 26:
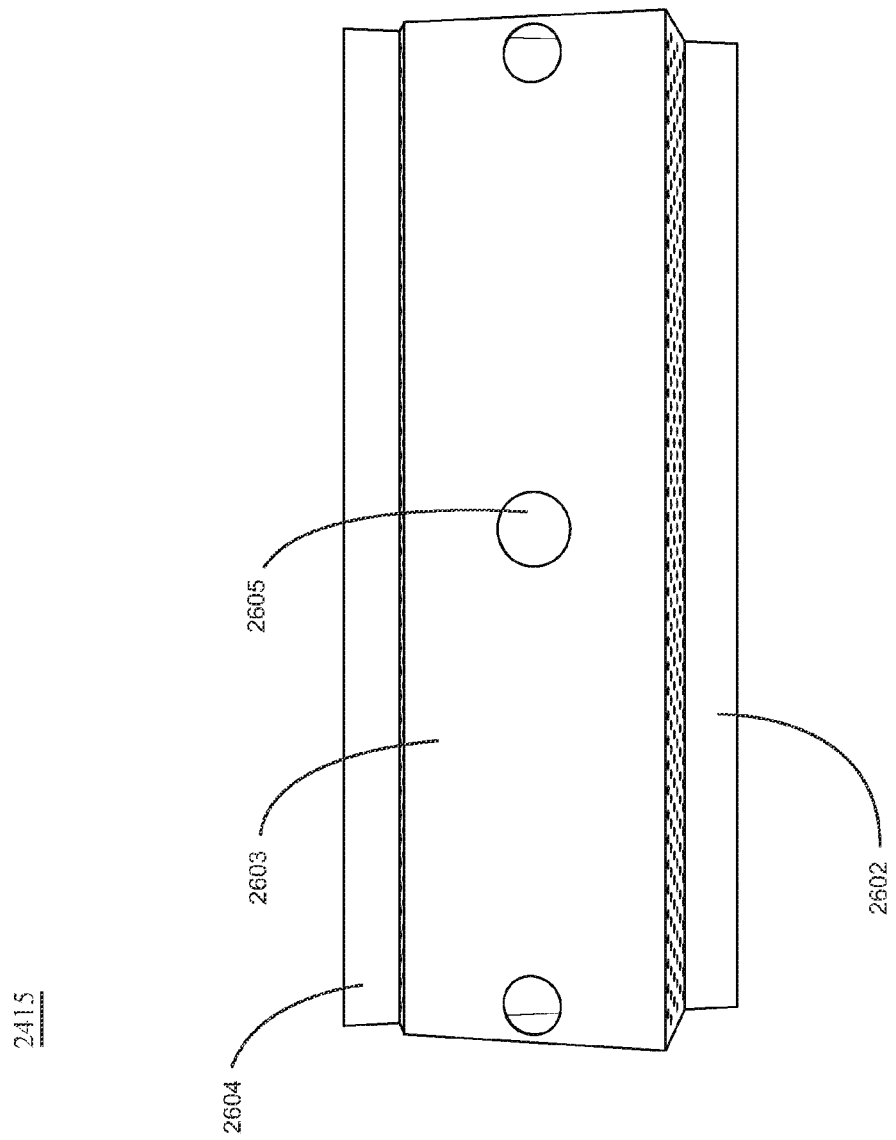
FIG. 26 is an example illustration of a frame included in the disclosed solar wall module shown in FIG. 24.

An example frame for each of the solar power units 2410 included in the disclosed solar wall assembly is illustrated in FIG. 26. The frame 2415 comprises a top panel 2604, a bottom panel 2602, and a face plate 2603. As disclosed above, the top and bottom panels 2602, 2604 are bent 90° up and down, respectively, to attached the frame 2115 to the wall assembly. It is preferable that the top and bottom panels 2602, 2604 include perforations in the portions of the panels that are not attached to the wall assembly to allow for air to flow through the unit.

The face plate 2603 is attached to the top and bottom panels 2602, 2604 and supports the solar panel. One or more access openings 2605 are included on the face plate 2603 to allow connections to the one or more solar panels.

Figure 27:
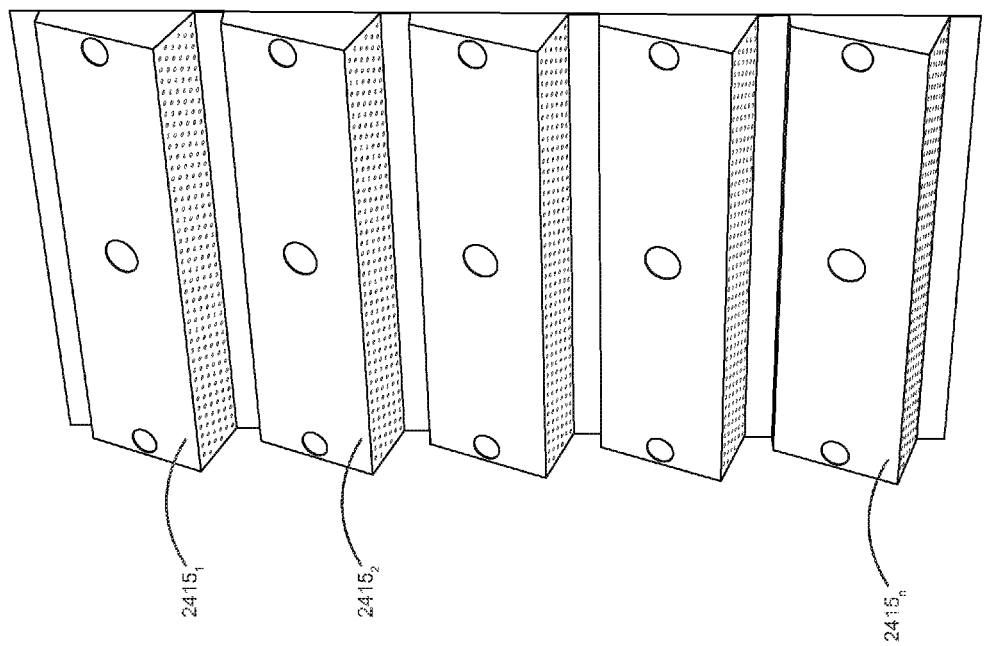
FIG. 27 is an example illustration of a plurality of frames shown in FIG. 26 attached together for use in the solar wall module.

In accordance with a preferred fabrication of the frame 2415, the bent portion of the top panel $2603_2$ of frame $2415_2$ is attached to the bent portion of the bottom panel $2602_1$ of frame $2415_1$, and so on. An example illustration of the frames attached in this manner is shown in FIG. 27.

Referring back to FIG. 24, solar panels $2401_{1...n}$ are attached to the frame $2415_{1...n}$ directly using screws, for example, or a front cover (not shown) as disclosed above.

Figure 28:
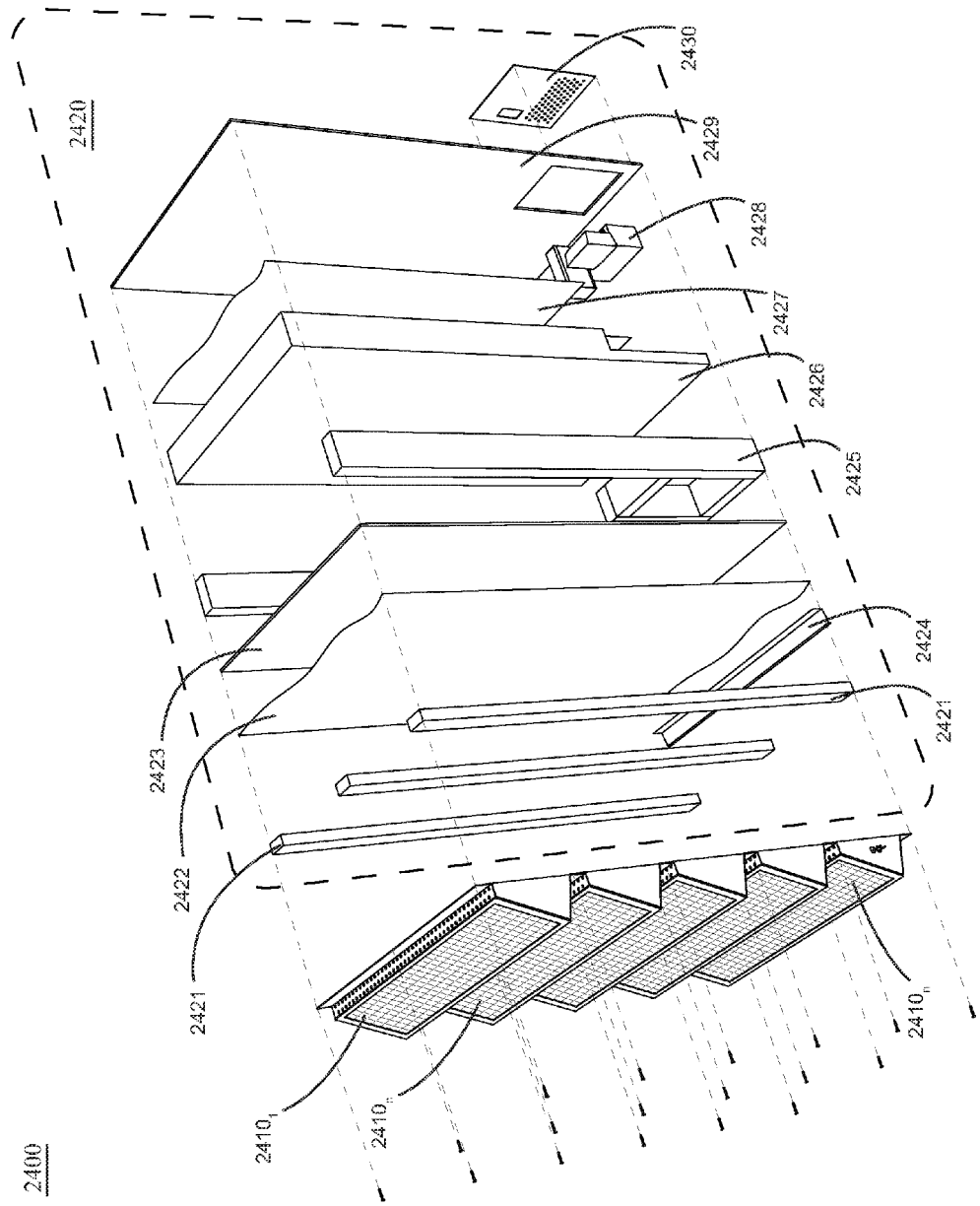
FIG. 28 is an example illustration of an exploded view of the disclosed solar wall module shown in FIG. 24.
Figure 29:
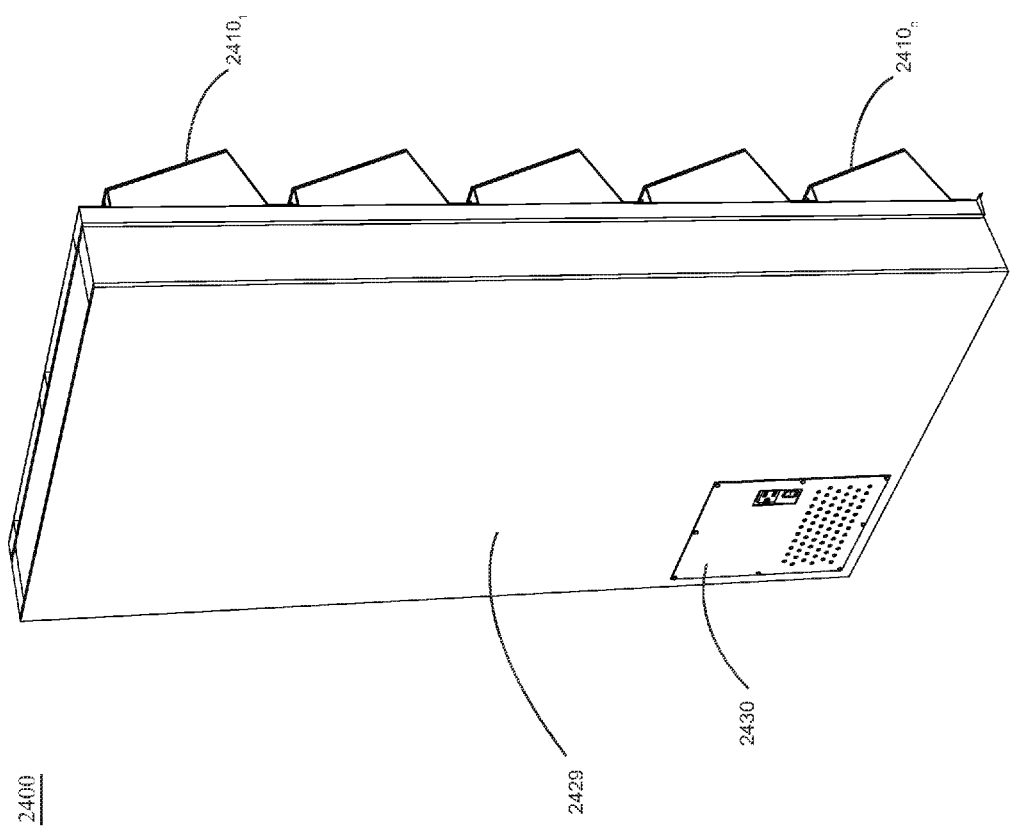
FIG. 29 is an example illustration of a rear perspective view of the disclosed solar wall module shown in FIG. 24.

The wall assembly 2420, attached to the plurality of solar power units $2410_{1...n}$, supports the solar power units in the building structure and acts as a part of a wall for the building structure. An exploded view of the solar wall module 2400 is illustrated in FIG. 28. The wall assembly comprises an outer barrier and an inner barrier. The outer barrier is the portion of the wall assembly that is directly touching the solar power system, and includes a water barrier 2422, furring strip 2421 and sheathing 2423. An air and water barrier 2422 material may serve as a drainage plane for water to escape quickly at the bottom of the panel. This material may also prevent water and outside air from penetrating into the building. Metal flashing 2424 may also be included in the outer barrier to protect against water entering in the walls.

Since the disclosed implementation is a wall module that will be fitting within the framework of a building structure, the wall assembly's 2420 inner barrier includes two studs 2450, preferably spaced apart the same distance as the studs in the other portions of the building structure, for example 24". The height of the studs 2450 depends on the size selection of the solar wall module 2400. Structural studs could be made of wood or metal and may serve as the structural layer of the assembly 2420 to enable the solar wall module 2400 to be robust and withstand wind loads.

The inner barrier further includes a rigid insulation core 2426 that may be used as a thermal barrier and to prevent unwanted hot and cold air from penetrating into the building and significantly lowering utility bills. A moisture barrier 2427 may be used to prevent condensation from building up within the insulation 2426. Gypsum board or sheet rock 2429 may be used to provide an interior rigid material which may be painted or covered with a finishing material like paint, wall-paper, or wood trim, etc.

Figure 30:
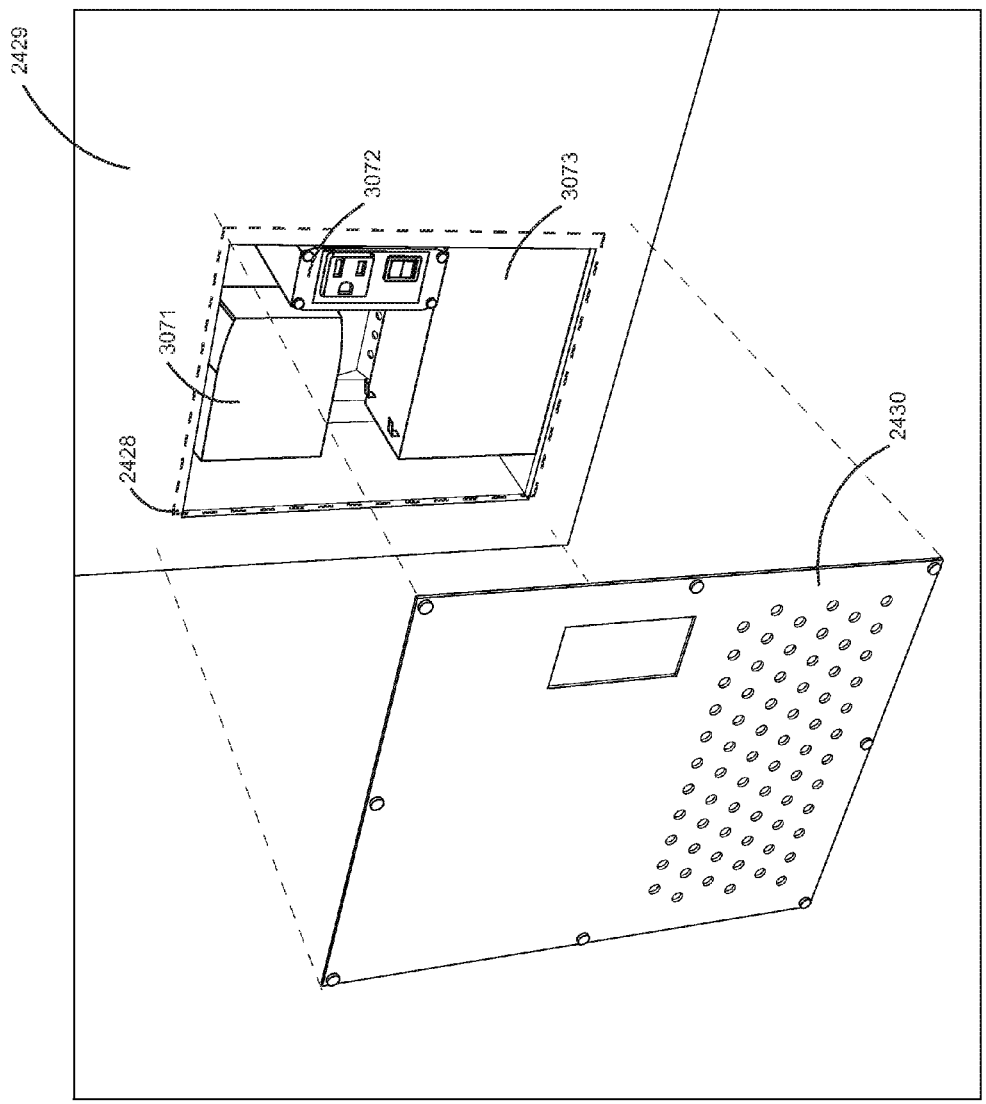
FIG. 30 is an example illustration of the power component included in the disclosed solar wall module.

The solar wall module 2400 further includes a power component 2428. As illustrated in FIGS. 28 and 30, the power component 2428 is preferably enclosed within a cavity in the insulation 2426 and the sheet rock 2429. The power component 2428 comprises an inverter 3072, a battery 3073 and charge controller 3071. The inverter 3072 may be equipped with a traditional 120 volt outlet and can be accessed and plugged directly into from either the interior, as shown in FIG. 30, or exterior side of the wall, as shown in FIG. 24.

A removable metal panel 2430 may cover the pocket of the wall that holds power components. The panel 2430 may be perforated to allow ventilation to the equipment and accommodates a socket for the outlet.

Figure 31:
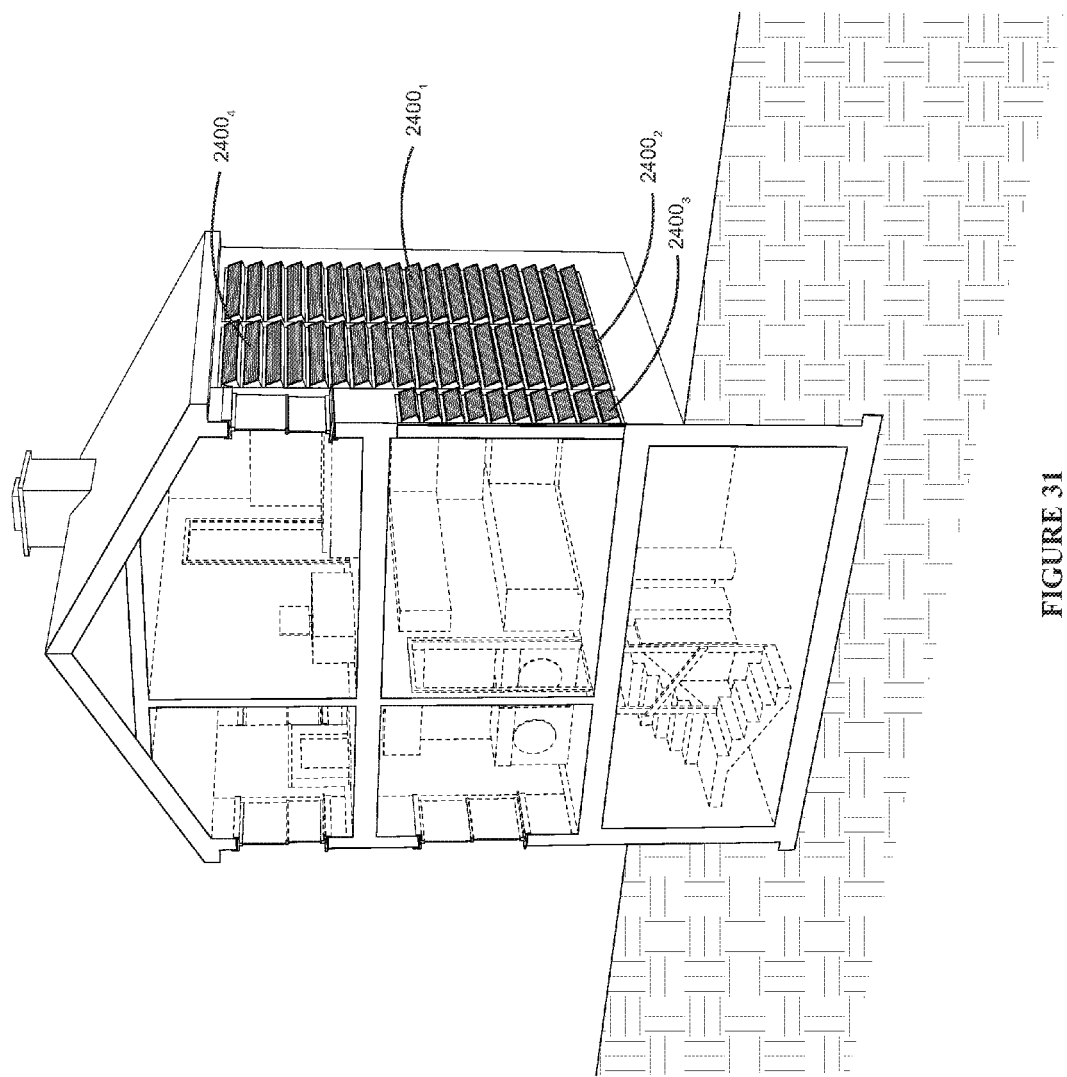
FIG. 31 is an example illustration of a plurality of solar wall modules installed in a home.

FIG. 31 illustrates an example of a plurality of solar wall modules 2400$_{1...n}$ installed in a building structure, such as a residential home.

The disclosed solar power unit is an improvement over existing Building Integrated Photovoltaic products for several reasons. As disclosed above, the solar power unit may be an all-in-one, plug-n-play system. Also, the disclosed solar power units are structurally integrated and may significantly reduce cost by serving as both the structural layer and exterior, finish layer, of the building.

The disclosed solar power system replaces, or can be used in conjunction with traditional building material and may be integrated with concrete block or brick in the same wall system. The entire wall does not have to entirely be made out of the solar power systems. For example, a customer may have a specific energy load (electric lighting) that they are interested in generating from the Solar Power systems. The number of units that would generate this electric load would be utilized and the rest of the wall may be constructed with another traditional block material.

There are many commercial applications for this product. Not only can the Solar Power Units be utilized for new building construction projects (commercial, residential, industrial, civil, educational, etc.), they can also be utilized for retrofit applications as well, over existing facades and serve as charging walls for electric devices or vehicles.

Since the solar power unit is designed to be a modular unit, it may be utilized for many applications at varying scales. The units may become a part of our daily lives. Walls of cities and towns may replace power plants.

Based on the foregoing description, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention. Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements, the present invention being limited only by the claims appended hereto and the equivalents thereof.

What is claimed is:

1. A method for integrating a solar power unit, for generating a power signal, into a building structure, the building structure including a plurality of building blocks stacked on top of each other, the solar power unit comprising a frame for supporting a solar panel and a front cover, the frame including a top panel and a bottom panel spaced apart to allow a building block to be disposed between, the method comprising:
    attaching the frame of the solar power unit to a first building block of the plurality of building blocks, such that the top panel is disposed between the first building block and a second building block stacked on and adjacent to the first building block;
    installing the solar panel on the attached frame;
    securing the solar panel to the attached frame with the front cover; and
    electrically connecting the solar power unit to a second solar power unit integrated into the building structure.

2. The method of claim 1, wherein the solar power unit further comprises a power outlet for providing the generated power signal to an electronic device coupled to the power outlet.

3. The method of claim 2, wherein the plurality of building blocks are cinder blocks.

4. The method of claim 3, wherein the building structure is an exterior cinderblock wall.

5. The method of claim 4, wherein attaching the frame to the building block comprises sliding the top panel and bottom panel of the frame over the top and bottom of the cinder block.

6. The method of claim 5, wherein the cinderblock wall is under construction, such that a cinder block with the solar power unit is installed in the exterior wall during construction.

7. The method of claim 5, wherein the exterior wall is a pre-existing wall, wherein each of the building blocks in the wall are bonded together with a bonding material.

8. The method of claim 7, further comprising creating a cut-out in the bonding material between the frame attached cinder block and the cinder blocks above and below the frame attached cinderblock, such the top and bottom panels of the frame slide into the cut-outs.

9. The method of claim 4, wherein the exterior wall is a pre-existing wall, wherein each of the cinder blocks in the wall are bonded together with a bonding material; and wherein attaching the frame of the solar power unit comprises affixing the top panel and bottom panel of the frame through the bonding material above and below the frame attached cinderblock.

10. The method of claim 2, wherein attaching the frame of the solar power unit comprises affixing the top panel and bottom panel of the frame directly on the building structure.

11. A method for integrating a solar power system that provides a power signal into a building structure, the building structure including a plurality of building blocks stacked on top of each other, the solar power system including a plurality of solar power units, each solar power unit comprising a frame for supporting a solar panel and a front cover, the frame including a top panel and a bottom panel spaced apart to allow a building block to be disposed between, the method comprising:

attaching the frames of each of the solar power units to a corresponding one of the plurality of building blocks, such that the top panel is disposed between the corresponding one of the plurality of building blocks and a second building block stacked on and adjacent to the corresponding one of the plurality of building blocks;

installing the solar panel on each of the attached frames;

securing the solar panel to each of the attached frames with the corresponding front cover; and electrically connecting each solar power unit to one another.

12. The method of claim 11, wherein at least one of the solar power units further comprises a power outlet for providing the generated power signal to a power sink.

13. The method of claim 12, wherein the plurality of building blocks are cinder blocks.

14. The method of claim 13, wherein the building structure is an exterior cinderblock wall.

15. The method of claim 14, wherein attaching each frame to the building block comprises sliding the top panel and bottom panel of the frame over the top and bottom of the respective cinder block.

16. The method of claim 15, wherein the cinderblock wall is under construction, such that each cinder block with the solar power unit attached is installed in the exterior wall during construction.

17. The method of claim 15, wherein the exterior wall is a pre-existing wall, wherein each of the building blocks in the wall are bonded together with a bonding material.

18. The method of claim 17, further comprising creating a cut-out in the bonding material between the frame attached cinder block and the cinder blocks above and below the frame attached cinderblock, such the top and bottom lower panels of the frame slide into the cut-outs.

19. The method of claim 14, wherein the exterior wall is a pre-existing wall, wherein each of the building blocks in the wall are bonded together with a bonding material; and wherein attaching the frame of the solar power unit comprises affixing the top panel and bottom panel of the frame through the bonding material above and below the frame attached cinderblock.

20. The method of claim 12, wherein attaching the frame of the solar power unit comprises affixing the top panel and bottom panel of the frame directly on the building structure.

* * * * *